(12) United States Patent
Yamazaki et al.

(10) Patent No.: US 7,476,908 B2
(45) Date of Patent: Jan. 13, 2009

(54) LIGHT EMITTING DEVICE

(75) Inventors: Shunpei Yamazaki, Setagaya (JP); Hideto Ohnuma, Atsugi (JP); Aya Anzai, Tsukui (JP); Masayuki Sakakura, Ebina (JP); Hiromichi Godo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/121,070

(22) Filed: May 4, 2005

(65) Prior Publication Data
US 2005/0258443 A1  Nov. 24, 2005

(30) Foreign Application Priority Data
May 21, 2004  (JP) ............... 2004-152522

(51) Int. Cl.
*H01L 29/207* (2006.01)
*H01L 33/00* (2006.01)
(52) U.S. Cl. .............. 257/93; 257/59; 257/72; 257/79; 257/88; 257/E33.001; 257/E33.055; 257/E33.067; 257/E33.068; 257/E33.07
(58) Field of Classification Search ........ None
See application file for complete search history.

(56) References Cited
U.S. PATENT DOCUMENTS

| | | | |
|---|---|---|---|
| 5,583,369 | A | 12/1996 | Yamazaki et al. |
| 5,640,067 | A | 6/1997 | Yamauchi et al. |
| 5,696,386 | A | 12/1997 | Yamazaki |
| 5,897,328 | A | 4/1999 | Yamauchi et al. |
| 6,850,005 | B2 | 2/2005 | Yoneda et al. |
| 6,924,508 | B2 | 8/2005 | Yoneda et al. |
| 2002/0145142 | A1 | 10/2002 | Chen et al. |
| 2003/0061984 | A1* | 4/2003 | Maekawa et al. ...... 117/4 |

(Continued)

FOREIGN PATENT DOCUMENTS

CN  1481199  3/2004

(Continued)

OTHER PUBLICATIONS

Wolf.S et al., Silicon Processing for the VLSI Era, 1986, vol. 1, pp. 532-534, Lattice Press.

*Primary Examiner*—Andy Huynh
*Assistant Examiner*—Hoang-Quan T Ho
(74) *Attorney, Agent, or Firm*—Eric J. Robinson; Robinson Intellectual Property Law Office, P.C.

(57) ABSTRACT

An object of the invention is to provide a light emitting device in which the variation in emission spectrum depending on an angle for seeing a surface through which light is emitted is reduced. The light emitting device of the invention includes a first insulating layer formed over a substrate, a second insulating layer formed over the first insulating layer, and a semiconductor layer formed over the second insulating layer. A gate insulating layer is formed to cover the second insulating layer and the semiconductor layer. A gate electrode is formed over the gate insulating layer. A first interlayer insulating layer is formed to cover the gate insulating layer and the gate electrode. An opening is formed through the first interlayer insulating layer, the gate insulating layer and the second insulating layer. A second interlayer insulating layer is formed to cover the first insulating layer and the opening. A light emitting element is formed over the opening.

34 Claims, 16 Drawing Sheets

U.S. PATENT DOCUMENTS

| | | | |
|---|---|---|---|
| 2003/0116768 A1* | 6/2003 | Ishikawa | 257/79 |
| 2004/0066136 A1* | 4/2004 | Yoneda et al. | 313/505 |
| 2004/0082118 A1 | 4/2004 | Chang et al. | |
| 2004/0232424 A1* | 11/2004 | Hotta et al. | 257/72 |
| 2005/0145861 A1* | 7/2005 | Kawakami et al. | 257/88 |
| 2005/0179372 A1* | 8/2005 | Kawakami et al. | 313/506 |
| 2005/0242713 A1* | 11/2005 | Yamazaki | 313/503 |
| 2005/0255617 A1* | 11/2005 | Yamazaki et al. | 438/22 |
| 2005/0258443 A1 | 11/2005 | Yamazaki et al. | |

FOREIGN PATENT DOCUMENTS

| | | |
|---|---|---|
| CN | 1481203 | 3/2004 |
| GB | 2 286 081 | 8/1995 |
| JP | 07-211458 | 8/1995 |
| JP | 10-289784 | 10/1998 |
| JP | 2004-070351 | 3/2004 |

* cited by examiner example of the invention comparative example 1 comparative example 2 (ideal change in spectral shape)

example of the invention comparative example

LIGHT EMITTING DEVICE

BACKGROUND OF THE INVENTION

1. Field of the Invention

The present invention relates to an active matrix light emitting device, and in particular, relates to a structure of a portion through which light is emitted.

2. Description of the Related Art

A light emitting device utilizing light emitted by an electroluminescent element (a light emitting element) has been attracting attention as a display device with a wide viewing angle and low power consumption.

Light emitting devices that are mainly used for displaying images are classified into an active matrix light emitting device and a passive matrix light emitting device. An active matrix light emitting device can control lighting, non-lighting and the like of light emitting elements for each light emitting element. Therefore, the active matrix light emitting device can be driven at lower power consumption than a passive matrix light emitting device, and hence, the active matrix display device is suitable to be mounted not only on a small electric appliance (e.g., a cellular phone) as its display portion but also on a large size television receiver or the like as its display portion.

In addition, with respect to an active matrix light emitting device, a circuit for driving a light emitting element is provided for each light emitting element. The circuits and the light emitting elements are arranged over a substrate such that light emitted from the light emitting elements to the outside is not hindered by the circuits. Also, a plurality of insulating layers with light transmitting properties are laminated in portions overlapping with the light emitting elements and light is emitted to the outside through these insulating layers. These insulating layers are provided to form a transistor, which is a constituent element of the circuit, a circuit element such as a capacitor element, or a wiring.

When light passes through the laminated insulating layers, multiple interference of light is sometimes caused due to difference in refractive index of the respective insulating layers. This causes problems in which the emission spectrum is changed depending on an angle for seeing a surface through which light is emitted, and the visibility of an image displayed on the light emitting device is deteriorated.

Also, the deterioration in visibility of an image, which is caused due to the variation in refractive index for each layer, is also caused in a passive matrix light emitting device. For example, the patent document 1 raises a problem in which the visibility is deteriorated by reflecting outside light and light emitted from a light emitting element at an interface due to the variation in refractive index of respective layers constituting the light emitting element. The patent document 1 proposes a light emitting element with an improved element structure so as to overcome this problem.

[Patent Document 1] Japanese Patent Application Laid-Open No. Hei 7-211458

SUMMARY OF THE INVENTION

It is an object of the present invention to provide a light emitting device in which the variation in emission spectrum depending on an angle for seeing a surface through which light is emitted is reduced.

A light emitting device solving the above problem includes a first insulating layer formed over a substrate, a second insulating layer formed on the first insulating layer, and a semiconductor layer formed on the second insulating layer. Further, a gate insulating layer is formed to cover the second insulating layer and the semiconductor layer. A gate electrode is formed on the gate insulating layer. A first interlayer insulating layer is formed to cover the gate insulating layer and the gate electrode. An opening is formed in the first interlayer insulating layer, the gate insulating layer and the second insulating layer. A second interlayer insulating layer is formed to cover the first insulating layer and the opening. A light emitting element is formed over the opening.

By applying the structure of the light emitting device according to the invention, it is possible to provide a light emitting device in which the variation in emission spectrum depending on an angle for seeing a surface through which light is emitted is reduced.

DETAILED DESCRIPTION OF THE INVENTION

Figure 1:
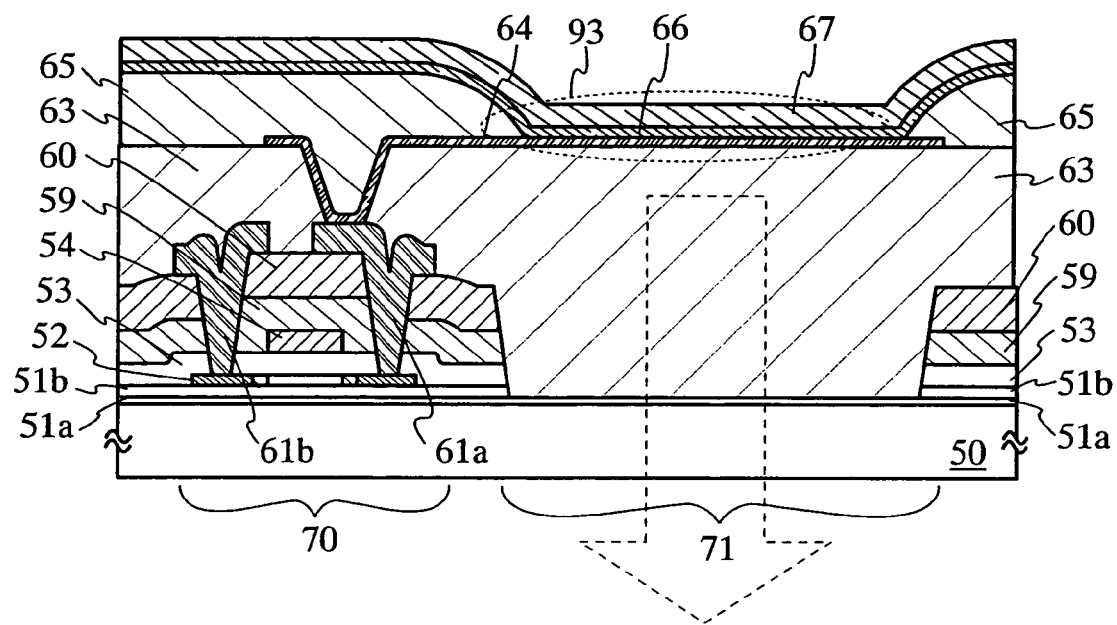
FIG. 1 is a cross sectional view showing an example of a structure according to the present invention.

The embodiment modes and an embodiment according to the present invention will hereinafter be described referring to the accompanying drawings. Further, the present invention can be carried out in many different modes, and it is easily understood by those who skilled in the art that embodiment modes and details herein disclosed can be modified in various ways without departing from the purpose and the scope of the invention. The present invention should not be interpreted as being limited to the description of the embodiment modes and embodiment to be given below.

Embodiment Mode 1

A light emitting device of the present invention will be described with reference to FIG. 1. A first base insulating layer 51a and a second base insulating layer 51b are provided over a substrate 50. A thin film transistor 70 including a semiconductor layer 52, a gate insulating layer 53 and a gate electrode 54 is formed on the second base insulating layer 51b. Also, the thin film transistor 70 is covered with an insulating film (a hydrogenated film) 59 and a first interlayer insulating layer 60. A connection portion (wiring) 61a and a wiring 61b that also serve as a source electrode and a drain electrode of the thin film transistor 70 are formed on the first interlayer insulating layer 60. The connection portion 61a and the wiring 61b are partly and electrically connected to the semiconductor layer 52 through contact holes passing through the insulating film (hydrogenated film) 59, the first interlayer insulating layer 60 and the gate insulating layer 53. A second interlayer insulating layer 63 is formed to cover the connection portion 61a, the wiring 61b and the first interlayer insulating layer 60. A light emitting element 93 is formed on the second interlayer insulating layer 63.

A material with a light transmitting property such as glass and quartz is used as the substrate 50 here. Alternatively, a flexible material such as plastic may be used as the substrate 50. In addition, the substrate 50 can be made from other material with a light transmitting property as long as it serves as a support medium for supporting the thin film transistor 70 and the light emitting element 93.

The first base insulating layer 51a and the second base insulating layer 51b are provided to prevent an impurity element (ion), which adversely affects characteristics of a semiconductor film, such as alkali metal and alkali earth metal contained in the substrate 50 from dispersing into the semiconductor layer. It is known that a film mainly containing silicon nitride has a significant effect of blocking the impurity element (ion). On the other hand, a film mainly containing silicon oxide has advantages of a superior electrical isolation property and a wider band gap along with a lower trap level as compared with the film mainly containing silicon nitride.

In this embodiment mode, a base insulating layer includes two layers of the first base insulating layer 51a and the second base insulating layer 51b laminated on the first base insulating layer. As mentioned above, the first base insulating layer 51a is preferably made from a film mainly containing silicon nitride while the second base insulating layer 51b is preferably made from a film mainly containing silicon oxide. Further, the first base insulating layer 51a is formed of silicon nitride containing oxygen with a thickness of 50 nm and the second base insulating layer 51b is formed of silicon oxide containing nitrogen with a thickness of 100 nm. This structure can provide a significant effect of blocking an impurity element (ion) along with high reliability of the thin film transistor.

The gate insulating layer 53 is made from an insulating layer containing silicon by plasma CVD or sputtering. The gate insulating layer may be formed to have a thickness of 40 to 150 nm. In this embodiment mode, a silicon oxide film containing nitrogen is formed to have a thickness of 100 nm as the gate insulating layer 53.

Although the gate insulating layer 53 includes a single layer in this embodiment mode, it may include laminated two or more layers. In this case, materials for laminating layers to form the gate insulating layer may be arbitrarily selected. However, there is a material for the gate electrode (such as Mo) that is easily deteriorated when it is formed in contact with an oxide film. When the gate electrode is made from such the material, a layer of the gate insulating layer contacting with the gate electrode is made from a film mainly containing silicon nitride so that the gate electrode can be operated stably.

The insulating film (hydrogenated film) 59 that is formed on the thin film transistor 70 is made from an insulating material containing silicon such as silicon nitride. This insulating film (hydrogenated film) 59 serves as a passivation film that prevents the thin film transistor 70 from an extraneous material, which adversely affects the thin film transistor 70. After forming the insulating film (hydrogenated film) 59 by using the material mainly containing silicon nitride, the insulating film (hydrogenated film) 59 is baked so that dangling bonds of the semiconductor layer 52 can be terminated by hydrogen contained in the insulating film (hydrogenated film) 59. Further, the insulating film (hydrogenated film) 59 is not an indispensable structure, and it may not be provided.

The light emitting element 93 has a light emitting layer 66 sandwiched between a first electrode 64 and a second electrode 67. Further, any one of the first electrode 64 and the second electrode 67 functions as an anode and the other one functions as a cathode. A light emitting element is isolated from other light emitting elements by a partition wall 65 that is also referred to as a bank. The partition wall 65 is formed to cover the edge of the first electrode 64. Preferably, the edge of the partition wall 65 covering the light emitting element at the side thereof has a curvature, and has a tapered shape in which the curvature is continuously varied.

The partition wall 65 may be formed of either an organic material or an inorganic material. Concretely, the partition wall 65 can be made from photosensitive or nonphotosensitive acrylic, polyimide, silicon oxide, silicon nitride, silicon oxide containing nitrogen, and the like. Also, siloxane may be used. The siloxane mentioned in the present specification comprises a skeleton structure including silicon (Si)-oxygen (O) bonds and an organic group containing at least hydrogen (e.g., alkyl group and aryl group) as a substituent. Additionally, the siloxane may also comprises fluorine as its substituent or comprises both the group containing hydrogen and fluorine.

The first electrode 64 is preferably made from a conductive material with a light transmitting property such as indium tin oxide (ITO). In addition to the ITO, ITO containing silicon oxide, IZO (indium zinc oxide) in which indium oxide is mixed with 2 to 20% zinc oxide, zinc oxide, GZO (gallium zinc oxide) in which zinc oxide is mixed with gallium, and the like may be used.

The light emitting layer 66 contains a light emitting substance and includes a single layer or plural layers. Further, the light emitting layer 66 is made from either an organic material or an inorganic material. Also, the light emitting layer 66 may contain both the organic and inorganic materials.

The first electrode 64 formed on the second interlayer insulating layer 63 is electrically connected to the connection portion 61a through the contact hole passing through the second interlayer insulating layer 63 so that the thin film transistor 70 and the light emitting element 93 are connected to each other.

An opening 71 is provided in a portion corresponding to the light emitting element 93, i.e., a light path through which light generated in the light emitting element 93 is emitted to the outside without providing the second base insulating layer 51*b*, the gate insulating layer 53, the insulating film (hydrogenated film) 59 and the first interlayer insulating layer 60 between the light emitting element 93 and the first base insulating layer 51*a*. That is, the opening 71 is formed to pass through the first interlayer insulating layer 60, the insulating film (hydrogenated film) 59, the gate insulating layer 53 and the second base insulating layer 51*b*.

The first base insulating layer 51*a* is exposed from the bottom face of the opening 71. The step formed by the opening 71 is filled with the second interlayer insulating layer 63 and leveled. In turn, the second interlayer insulating layer 63 and the first base insulating layer 51*a* are contacted to each other in the opening 71.

In this embodiment mode, the first interlayer insulating layer 60, the insulating film (hydrogenated film) 59, the gate insulating layer 53 and the second base insulating layer 51*b* are exposed at the side surface of the opening 71. The side surface of the opening 71 is sometimes rough due to the difference in etching rate depending on a condition of forming the opening.

When the second interlayer insulating layer 63 is made from a material with a self-planarizing property (e.g., a coating film such as acrylic, polyimide and siloxane), the opening, which is largely formed by removing the second base insulating layer 51*b*, the gate insulating layer 53, and the insulating film (hydrogenated film) 59, can be easily planarized.

Meanwhile, light generated in the light emitting element 93 is emitted to the outside of the display device through various kinds of layers inside of the display device. When the refractive indices of the layers through which light passes are different from one another, the multiple interference of light is caused by the influence of the reflection or refraction of light in each interface. Upon generating a standing wave by the multiple interference, a so-called viewing-angle dependency is caused in which color tone is changed when a light emitting surface of the display device is seen from a different angle. This is a reason for extremely reducing the quality of a display image for the display device.

However, the opening 71 is formed corresponding to the light path through which light generated in the light emitting element 93 is emitted according to the invention so that the number of films through which light generated in the light emitting element 93 is emitted to the outside of the display device can be reduced. Accordingly, the probability of causing a standing wave due to the multiple interference of light emitted from the light emitting element 93 can significantly be reduced. As a consequence, the probability of changing the emission spectrum depending on an angle to be seen can be reduced. More particularly, color shifts due to the viewing angle dependency can be prevented.

In the present invention, the base insulating layer includes the two layers of the first base insulating layer 51*a* that is made from a material mainly containing silicon nitride with an excellent effect of blocking an impurity contained in the substrate; and the second base insulating layer 51*b* that is made from a material mainly containing silicon oxide with a wide band gap, a superior electrical isolation property along with a low trap level. The semiconductor layer 52, which becomes an active layer of a thin film transistor, is formed in contact with the second base insulating layer 51*b* that is made from the material mainly containing silicon oxide. In addition, the first interlayer insulating layer 60, the insulating film (hydrogenated film) 59, the gate insulating layer 53 and the second base insulating layer 51*b* that exist in a portion corresponding to the light path through which light is emitted to the outside of the display device are removed so as to form the opening 71. This opening 71 is formed to correspond to the light path through which light generated in the light emitting element 93 is emitted to the outside of the display device.

This reduces the number of films or the number of interfaces existing in the light path through which light generated in the light emitting element 93 is emitted to the outside of the display device. Accordingly, reflection of light at the interfaces of films can be reduced, which allows to reduce the probability of causing a standing wave due to the multiple interference. Consequently, the viewing angle dependency of the display device is reduced. Also, since the first base insulating layer 51*a* made from the material mainly containing silicon nitride, which has an excellent effect of blocking an impurity from the substrate, remains in the opening 71, ingress of the impurity from the substrate can be prevented effectively, and hence, the characteristics of the thin film transistor can be maintained.

Figure 14A:
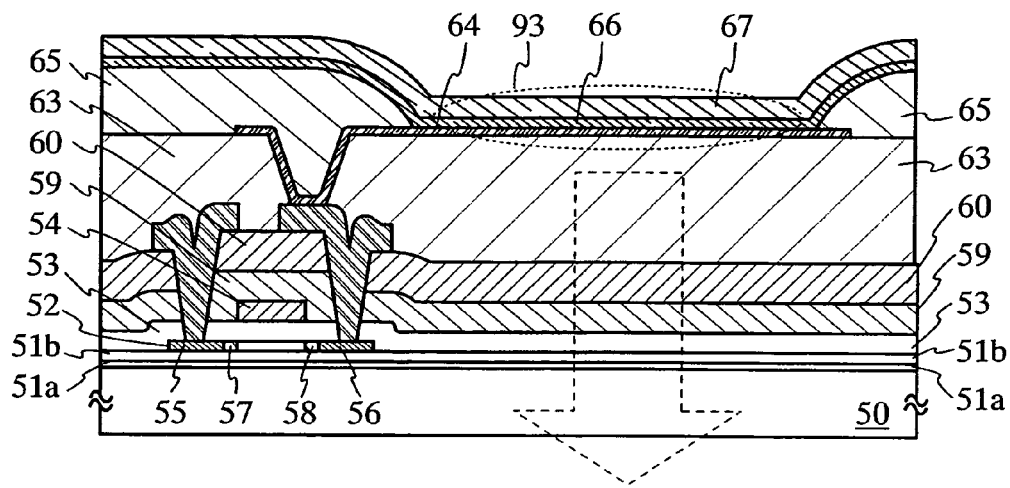
FIGS. 14A and 14B are cross sectional views showing examples of conventional structures.

However, in the case of a conventional structure as shown in FIG. 14A, the second base insulating layer 51*b*, the gate insulating layer 53, the insulating film (hydrogenated film) 59 and the first interlayer insulating layer 60 are provided in the light path through which light generated in the light emitting element 93 is emitted.

When the plural layers exist in the light path through which light generated in the light emitting element 93 is emitted as shown in FIG. 14A, a large amount of light is reflected, thereby increasing the probability of causing a standing wave. Therefore, a possibility of causing large variation in emission spectrum depending on an angle for seeing a surface through which light is emitted is increased.

Accordingly, these layers underlying the light emitting element 93 are removed in the present embodiment mode as shown in FIG. 1. In addition, after forming the opening 71, the second interlayer insulating layer 63 is made from an insulating material with a self-planarizing property so that unevenness caused by providing the opening 71 can be reduced, which contributes to the improvement of an aperture ratio.

Embodiment Mode 2

Figure 2A:
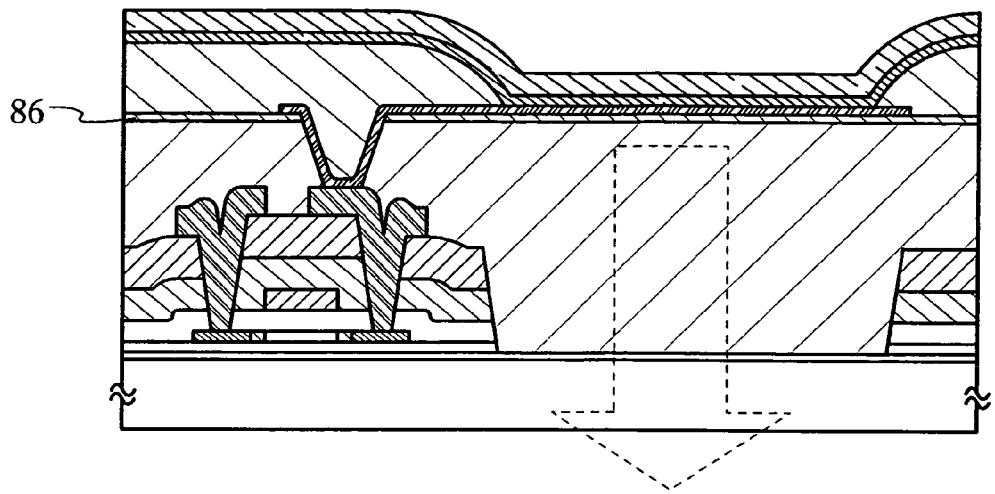
FIGS. 2A to 2C are cross sectional views showing examples of structures according to the invention.
Figure 2B:
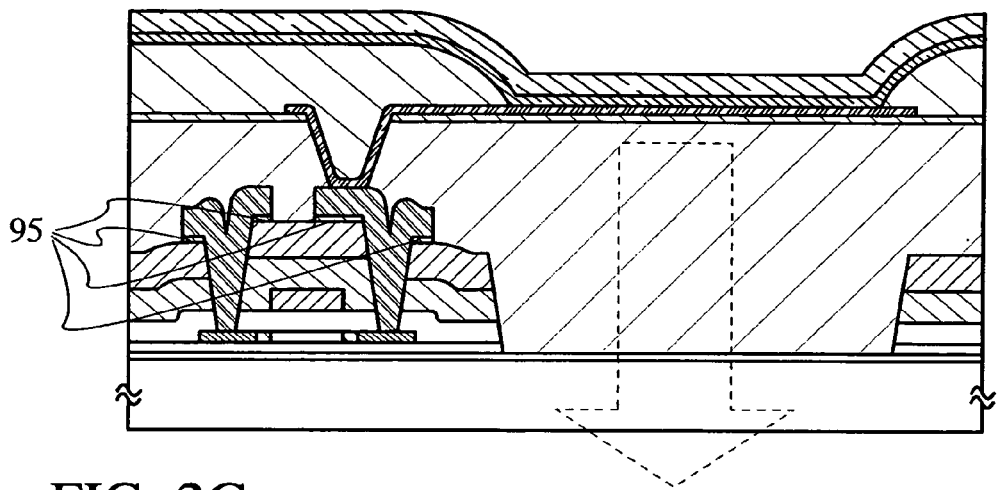
Figure 2C:
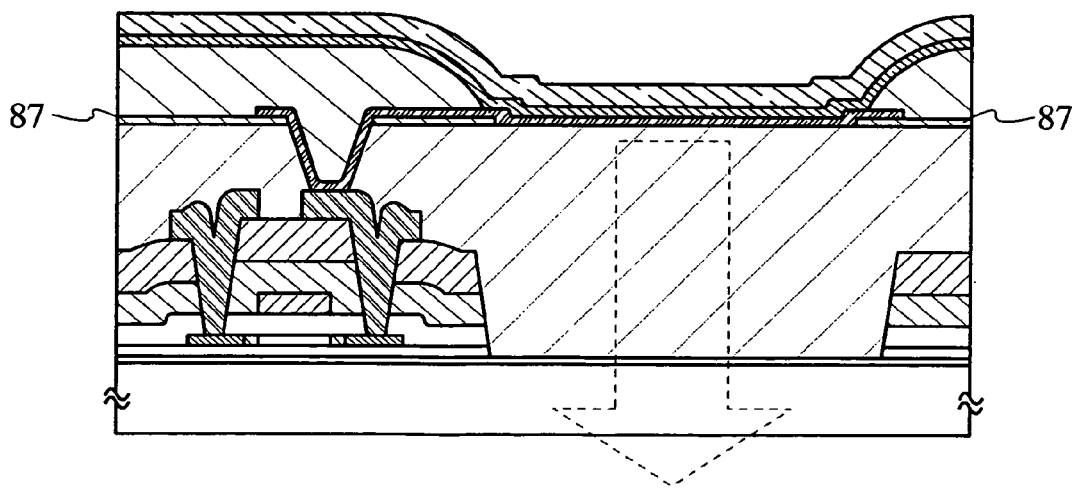

In this embodiment mode, another structures of the invention will be shown in FIGS. 2A to 2C. The structures described in this embodiment mode exhibit same effect as that of the structure described in Embodiment Mode 1. Characteristics of the respective structures will be described below. Further, portions identical to those of FIG. 1 are not denoted by the reference numerals, and will not be further explained. Refer to FIG. 1 and Embodiment Mode 1 for more information about the portions.

As shown in FIG. 2A, an insulating layer 86 made from a material different from that of the second interlayer insulating layer 63 may be formed on the second interlayer insulating layer 63. The insulating layer 86 is made from a silicon nitride film or the like. This insulating layer 86 serves to prevent the second interlayer insulating layer 63 from being etched in etching the first electrode 64 of the light emitting element 93 and serves to prevent ingress of moisture etc., which adversely affect the light emitting element 93 from the second interlayer insulating layer 63. If these problems are not concerned, the insulating layer 86 is, of course, not necessary to be provided.

FIG. 2B shows an example in the case of forming the first interlayer insulating layer 60 is made from a material that is etched in etching the connection portion 61*a* and the wiring 61*b*. An insulating layer 95 is formed between the first interlayer insulating layer 60 and the connection portion 61*a* and wirings 61*b* by using a different material of that of the first interlayer insulating layer. The insulating layer 95 is made from silicon nitride or the like. After forming the first interlayer insulating layer 60, the insulating layer 95 is formed over an entire surface of the substrate so as to cover the first interlayer insulating layer 60. In this case, the insulating layer 95 is formed to have a certain level of thickness such that the insulating layer 95 is partly etched to be removed in etching the connection portion 61a, the wiring 61b and the like. Accordingly, the insulating layer 95 can be prevented from remaining in the opening 71 while preventing the thickness of the first interlayer insulating layer 60 from being lessened. Further, although the insulating layer 86 as shown in FIG. 2A is also formed in FIG. 2B, the insulating layer 86 may, of course, not be provided.

FIG. 2C shows a structure in which an insulating layer 87 corresponding to the insulating layer 86 as shown in FIG. 2A is partly removed in a portion corresponding to the light path through which light generated in the light emitting element 93 is emitted to the outside of a display device. According to this structure, the insulating layer 87 can serve as an etching stopper while an unnecessary film is not provided in the light path. This structure can be applied to the insulating layer 95 as shown in FIG. 2B. Concretely, after forming the insulating layer 95 on the first interlayer insulating layer 60, the insulating layer 95 existing in the portion corresponding to the light path through which light generated in the light emitting element 93 is emitted to the outside of the display device, is removed prior to forming the second interlayer insulating layer 63.

According to the structures as shown in this embodiment mode, the number of films (the number of interfaces) existing in the light path through which light generated in the light emitting element 93 is emitted to the outside of the display device can be reduced, This allows to reduce the reflection of light in an interface of the films and the probability of causing a standing wave due to the multiple interference. Consequently, the viewing angle dependency of the display device can be reduced. Furthermore, since the first base insulating layer 51a, which is made from the material mainly containing silicon nitride with the excellent effect of blocking an impurity from the substrate, remains in the opening, the ingress of an impurity from the substrate can be effectively blocked, thereby maintaining the characteristics of the thin film transistor.

Moreover, the three structures as shown in FIGS. 2A to 2C can be combined with one another or combined with Embodiment Mode 1.

Embodiment Mode 3

Another embodiment mode of the invention will be described in FIGS. 3A to 3C. The structures as shown in the present embodiment mode exhibit same effect as that of Embodiment Mode 1. Characteristics of the respective structures will be described below. Further, portions identical to those of FIG. 1 are not denoted by the reference numerals and will not be further explained. Refer to FIG. 1 and Embodiment Mode 1 for more information about the portions.

Figure 3A:
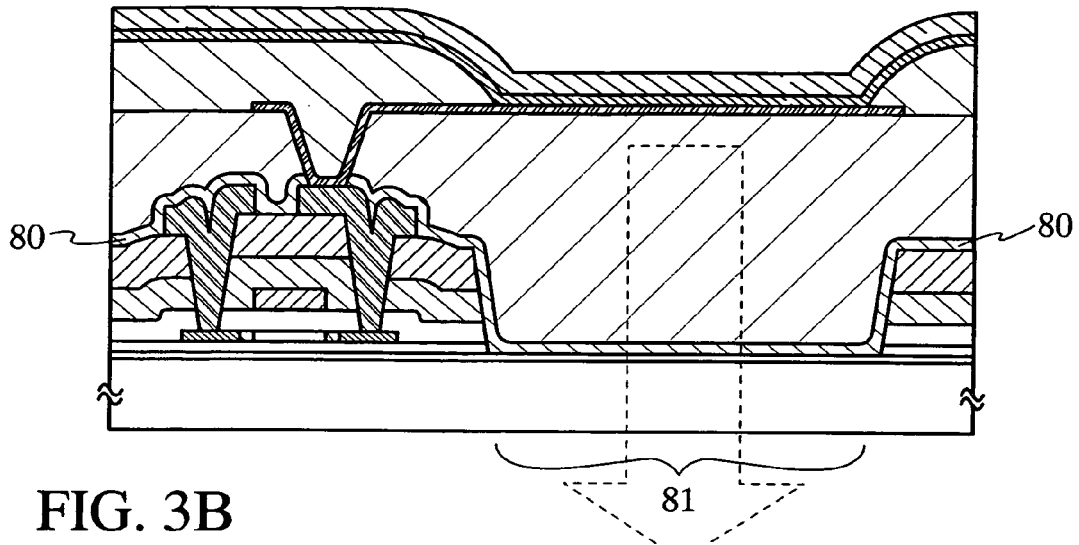
FIGS. 3A to 3C are cross sectional views showing examples of structures according to the invention.
Figure 3B:
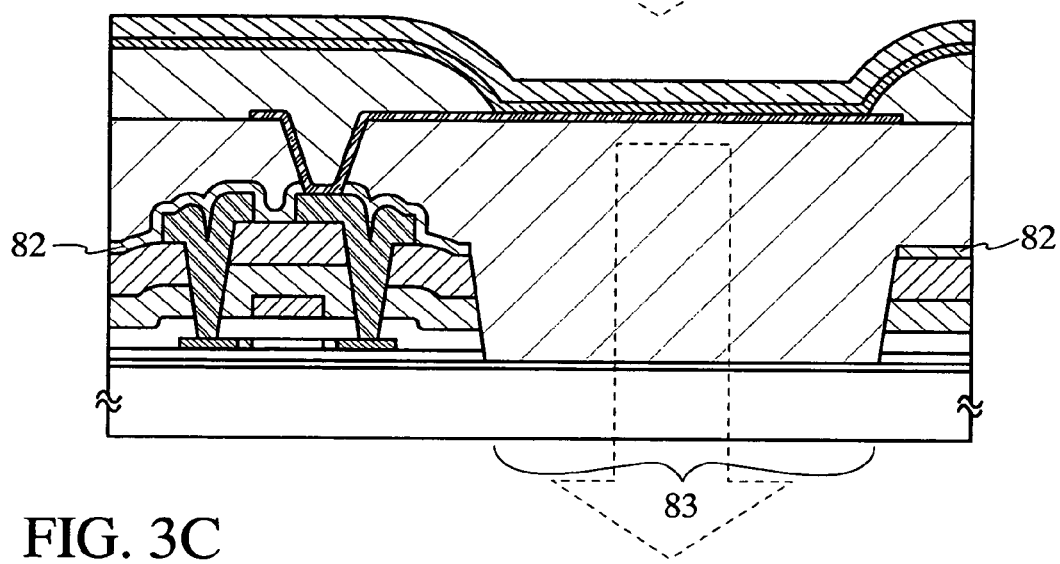
Figure 3C:
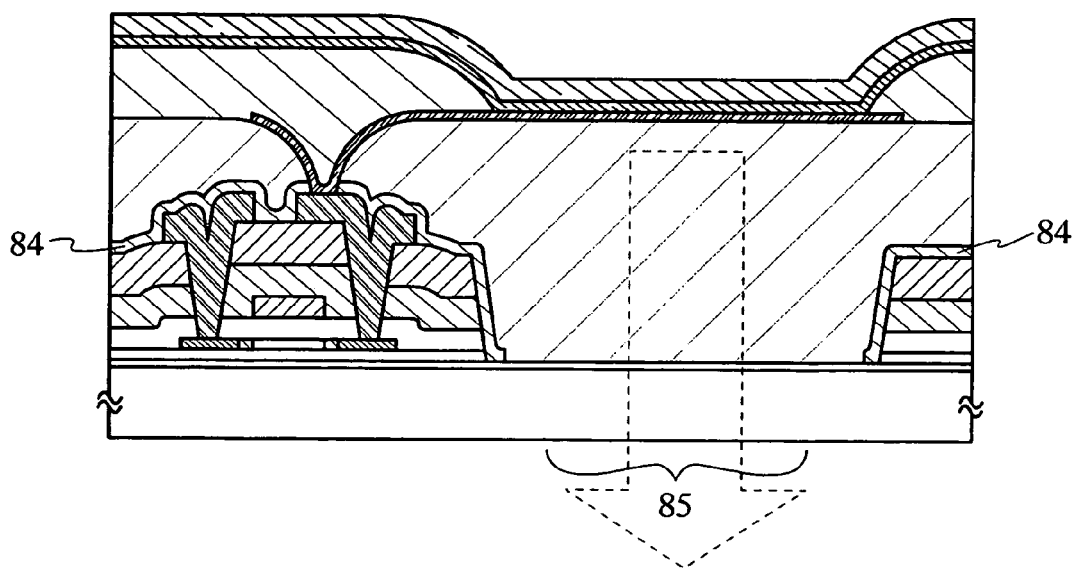

FIGS. 3A to 3C show cases where insulating layers 80, 82 and 84 are formed on each connection portion 61a and each wiring 61b. These insulating layers are used as passivation films for preventing active layers of the thin film transistors from an impurity. Therefore, a film mainly containing silicon nitride with an excellent passivation property is used as these insulating films. However, they may be formed of other material.

When forming the insulating layer 80, 82 or 84, if a refractive index of the insulating layer is similar to those of neighboring layers in the opening 71, the insulating layer may remain as it is since it does not adversely affect light. However, when the insulating layer is made from a material with a refractive index that is largely different from those of the neighboring layers, the insulating layer 80, 82 or 84 existing in the opening is preferably removed.

FIG. 3A shows a structure in which the insulating layer 80 is formed to cover the connection portion 61a, the wiring 61b, the first interlayer insulating layer 60 and an opening 81. In the case where a refractive index of the first base insulating layer 51a is similar to that of the insulating layer 80, the structure as shown in FIG. 3A may be employed.

FIG. 3B shows a structure in which the insulating layer 82 is formed to cover the connection portion 61a, the wiring 61b and the first interlayer insulating layer 60, and the insulating layer 82 existing in the side surface and the bottom surface of the opening 83 corresponding to a light path through which light generated in the light emitting element 93 is emitted to the outside of a display device, is removed. According to this structure, the arrangement of the insulating layer 82 does not reduce an aperture ratio.

FIG. 3C shows a structure in which the insulating layer 84 is formed to cover the connection portion 61a, the wiring 61b and the first interlayer insulating layer 60, and the insulating layer 80 existing in the bottom surface of an opening 85 is removed. According to this structure, since the edge of the opening 85 is covered with the insulating layer 84, an excellent passivation effect can be obtained.

According to the structures as shown in this embodiment mode, the number of films (the number of interfaces) existing in the light path through which light generated in the light emitting element 93 is emitted to the outside of the display device can be reduced. This allows to reduce the reflection of light in an interface of the films and the probability of causing a standing wave due to the multiple interference. Consequently, the viewing angle dependency of the display device can be reduced. Moreover, since the first base insulating layer 51a, which is made from the material mainly containing silicon nitride with the superior effect of blocking an impurity from the substrate, remains in the opening, the ingress of an impurity from the substrate can effectively be blocked, thereby maintaining the characteristics of the thin film transistor.

The present embodiment mode can be implemented by being combined with Embodiment Mode 1 or Embodiment Mode 2.

Embodiment Mode 4

Another embodiment mode of the invention will be described with reference to FIGS. 4A and 4B and FIGS. 5A and 5B. The structures as shown in this embodiment mode exhibit same effect as that of Embodiment Mode 1. Characteristics of the respective structures will be described below. Further, portions identical to those of FIG. 1 are not denoted by the reference numerals, and will not be further explained. Refer to FIG. 1 and Embodiment Mode 1 for more information about the portions.

Figure 4A:
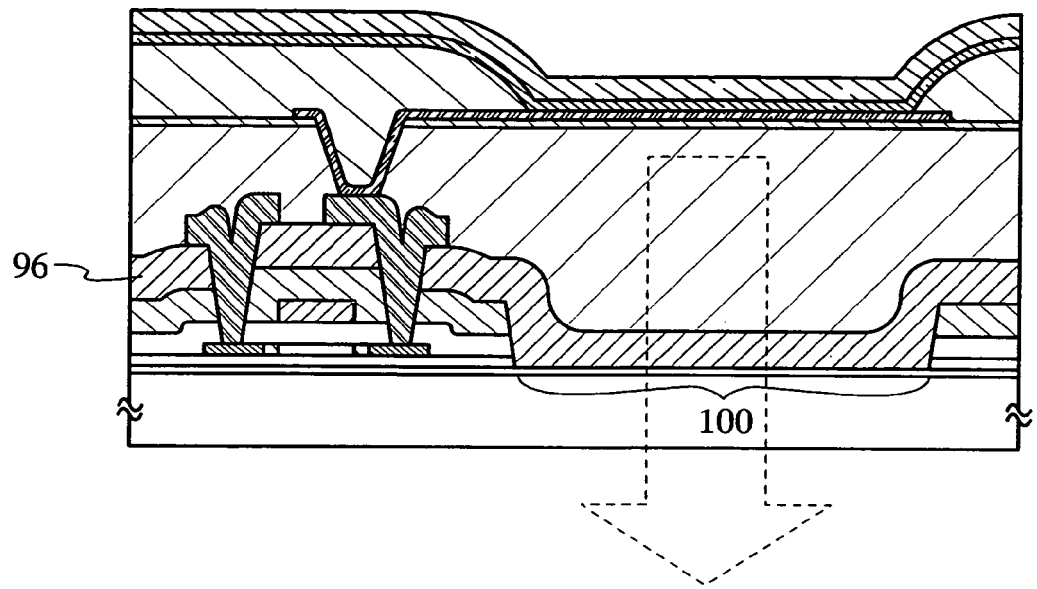
FIGS. 4A and 4B are cross sectional views showing examples of structures according to the invention.

In FIG. 4A, an opening 100 is formed to pass through the insulating film (hydrogenated film) 59, the gate insulating layer 53 and the second base insulating layer 51b. The first interlayer insulating layer 96 is formed to cover the insulating film (hydrogenated film) 59 and the opening 100. The connection portion 61a and the wiring 61b are formed to be electrically connected to the semiconductor layer 52 through contact holes provided in the first interlayer insulating layer 96, the insulating film (hydrogenated film) 59 and the gate insulating layer 53. The second interlayer insulating layer 63 is formed to cover the first interlayer insulating layer 96, the connection portion 61a and the wiring 61b.

When the first interlayer insulating layer 96 is made from a material with a refractive index that is similar to that of the second interlayer insulating layer 63 or the first base insulating layer 51a, this structure can exhibit same effect as the structure as shown in FIG. 1.

Figure 4B:
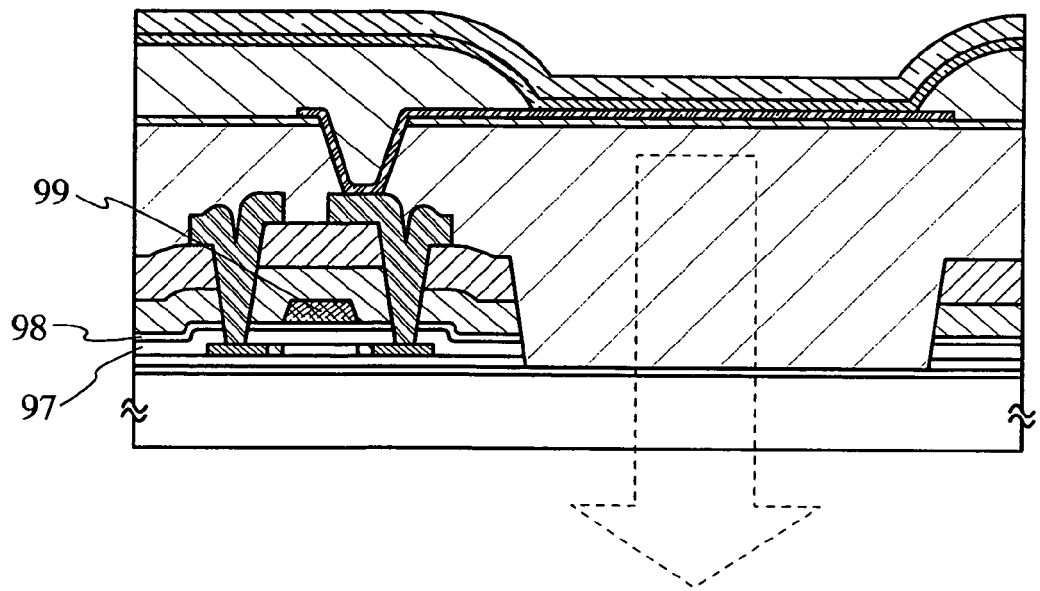

FIG. 4B shows a structure in which a gate insulating layer includes two layers of a first gate insulating layer 97 and a second gate insulating layer 98. The first gate insulating layer 97 and the second gate insulating layer 98 may be made from different materials each containing silicon. Preferably, the first gate insulating layer 97, which is in contact is the semiconductor layer 52, is made from a material mainly containing silicon oxide whereas the second gate insulating layer 98, which is in contact with the gate electrode 99, is made from a material mainly containing silicon nitride. When the gate insulating layer including the two layers is made from such the materials and the insulating film (hydrogenated film) 59 is made from a film mainly containing silicon nitride, a gate electrode 99 is surrounded by the films mainly containing silicon nitride and is not in contact with the film mainly containing silicon oxide. Therefore, if the gate electrode 99 is made from a material that is easily oxidized such as molybdenum, the gate electrode 99 can be maintained stably. In addition, since the first gate insulating layer 97, which is in contact with the semiconductor layer 52, is made from the material mainly containing silicon oxide, a low trap level can be obtained, and hence, a thin film transistor manufactured according to this structure can be operated stably.

Also, FIG. 4B shows an example in which a cross sectional shape of the gate electrode 99 has a trapezoidal shape. However, the cross section shape of the gate electrode 99 may not have such a shape.

Figure 5A:
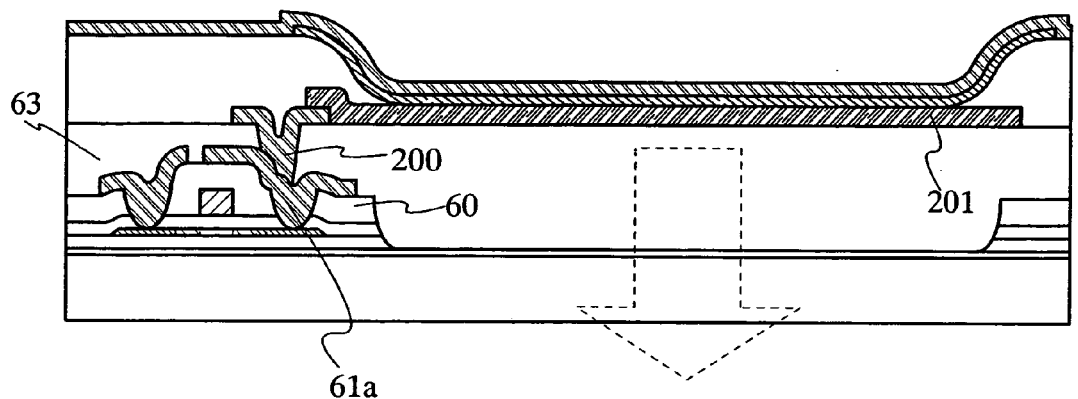
FIGS. 5A and 5B are cross sectional views showing examples of structures according to the invention.
Figure 5B:
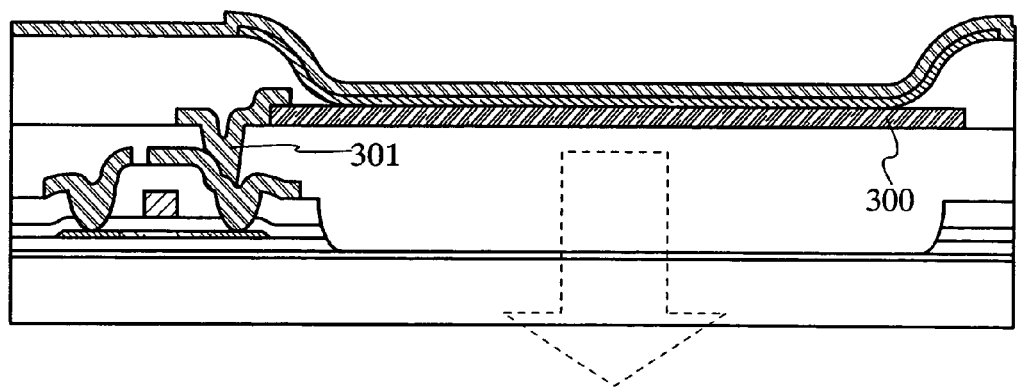

FIGS. 5A and 5B have different structures from those of FIGS. 4A and 4B wherein the connection portion 61a and the first electrode 64 of the light emitting element are connected to each other through a wiring rather than connected to each other directly. In FIG. 5A, a wiring 200 that is formed on the second interlayer insulating layer 63 is connected to the connection portion 61a through a contact hole and a first electrode 201 of a light emitting element 93 is connected to the wiring 200. FIG. 5B illustrates an almost similar structure to that of FIG. 5A, wherein after forming the second interlayer insulating layer 63, a first electrode 300 of the light emitting element is formed prior to forming a wiring 301.

Further, in FIG. 5A or 5B, the first interlayer insulating layer 60 is formed on the gate insulating layer 53 and the gate electrode 54, and the insulating film (hydrogenated film) 59 is not provided. In the present invention, the insulating film (hydrogenated film) 59 may not be provided as shown in FIGS. 5A and 5B. The same is equally true of other embodiment modes. Further, it is a matter of course that the insulating film (hydrogenated film) 59 may be provided in FIGS. 5A and 5B.

According to the structures of the present embodiment mode, the number of films (the number of interfaces) existing in the light path through which light generated in the light emitting element 93 is emitted to the outside of the display device can be reduced. This allows to reduce the reflection of light in an interface of the films and the probability of causing a standing wave due to the multiple interference. Consequently, the viewing angle dependency of the display device can be reduced. Moreover, since the first base insulating layer 51a, which is made from the material mainly containing silicon nitride with the excellent effect of blocking an impurity from the substrate, remains in the opening, the ingress of an impurity from the substrate can be effectively blocked, thereby maintaining the characteristics of the thin film transistor.

The present embodiment mode can be implemented by being freely combined with Embodiment Mode 1 through Embodiment Mode 3.

Embodiment Mode 5

Another embodiment mode of the invention will be described with reference to FIGS. 6A to 6C. The structures as shown in this embodiment mode exhibit same effect as that of Embodiment Mode 1. Characteristics of the respective structures will be described below. Further, portions identical to those of FIG. 1 are not denoted by the reference numerals, and will not be further explained. Refer to FIG. 1 and Embodiment Mode 1 for more information about the portions.

Figure 6A:
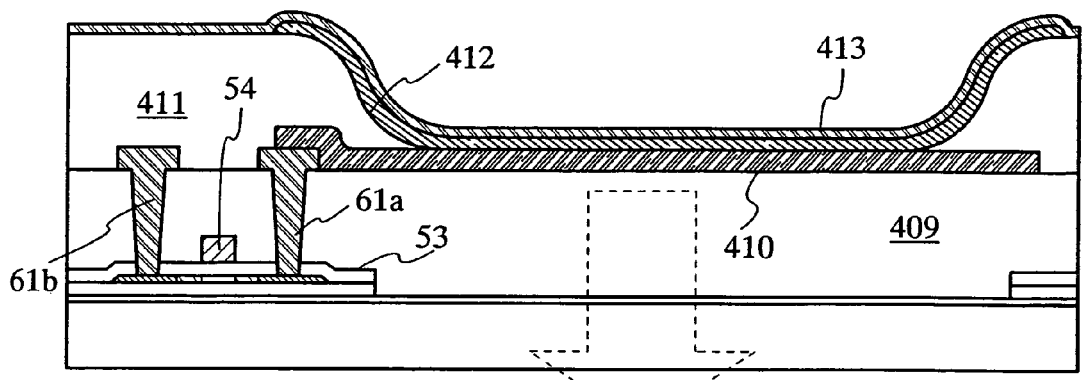
FIGS. 6A to 6C are cross sectional views showing examples of structures according to the invention.
Figure 6B:
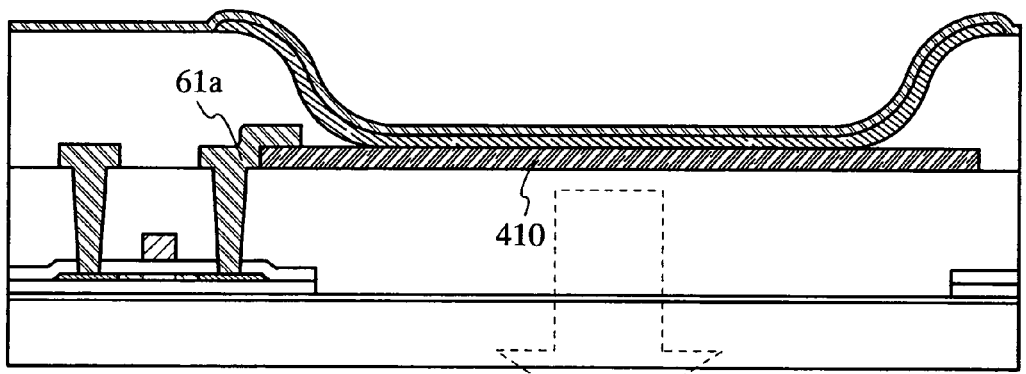

Each structure of the present embodiment mode as shown in FIGS. 6A and 6B shows an example in which the connection portion 61a, the wiring 61b and a first electrode 410 of the light emitting element 93 are formed on an interlayer insulating layer 409. In this embodiment mode, the interlayer insulating layer 409 is formed to cover the gate insulating layer 53 and the gate electrode 54. The connection portion 61a reaching the semiconductor layer 52 through contact hole and the wiring 61b are formed on the interlayer insulating layer 409.

The first electrode 410 of the light emitting element 93 is formed to be partly overlapped with the connection portion 61a. The light emitting element 93 is formed in contact with the interlayer insulating layer 409. The light emitting element 93 has a light emitting layer 41 sandwiched between the first electrode 410 and a second electrode 413. A light emitting element is isolated from other light emitting elements by a partition wall 411 that is also referred to as a bank.

The interlayer insulating layer 409 is preferably formed of an insulating material with a self-planarizing property so that an unevenness formed by the underlying thin film transistor or opening can be leveled. This can improve an aperture ratio of a display device.

FIG. 6A has a similar structure to that of FIG. 6B, except that the arrangement of the connection portion 61a and the first electrode 410 of the light emitting element is only different from each other. In FIG. 6A, since the first electrode 410 is formed after forming the connection portion 61a, the first electrode 410 is positioned on the connection portion 61a. On the other hand, in FIG. 6B, since the connection portion 61a is formed after forming the first electrode 410, the connection portion 61a is positioned on the first electrode 410.

Figure 6C:
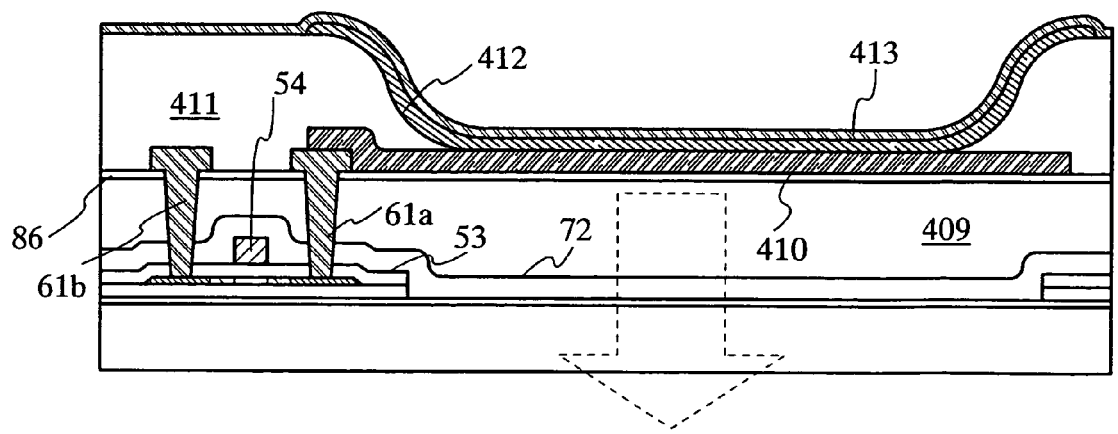

FIG. 6C has a similar structure to that of FIG. 6A, wherein the opening 71 is formed prior to forming an insulating film (a hydrogenated film) 72 and then the insulating film (hydrogenated film) 72 is formed on the gate insulating layer 53, the gate electrode 54 and the opening 71. FIG. 6C is greatly different from FIG. 6A in that the opening is covered with the insulating film (hydrogenated film) 72. When the insulating film (hydrogenated film) 72 is made from a same material as the interlayer insulating layer 409 or the first base insulating layer 51a, or a material with a refractive index similar to that of the interlayer insulating layer or the first base insulating layer, light is hardly reflected in an interface between the insulating film (hydrogenated film) 72 and the interlayer insulating layer 409 or the first base insulating layer 51a. As a consequence, the insulating film (hydrogenated film) 72 and the interlayer insulating layer 409 or the first base insulating layer 51a are optically equated to each other, and hence, the structure of FIG. 6C can exhibit same effect as that of FIG. 6A.

According to the structures of the present embodiment mode, the number of films (the number of interfaces) existing in the light path through which light generated in the light emitting element 93 is emitted to the outside of the display device can be reduced. This allows to reduce the reflection of light in an interface of the films and the probability of causing a standing wave due to the multiple interference. Consequently, the viewing angle dependency of the display device can be reduced. Furthermore, since the first base insulating layer 51a, which is made from the material mainly containing silicon nitride with the excellent effect of blocking an impurity from the substrate, remains in the opening, the ingress of an impurity from the substrate can be effectively blocked, thereby maintaining the characteristics of the thin film transistor.

Figure 14B:
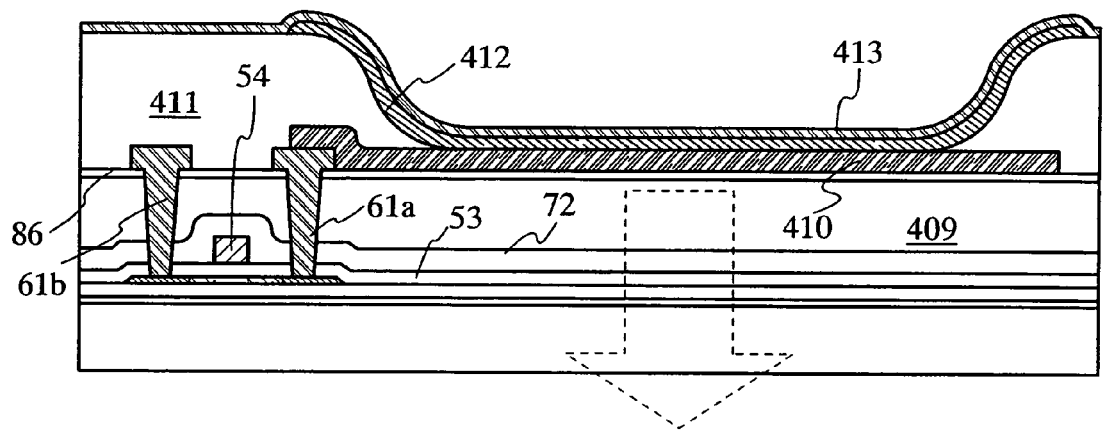

However, in the case of a conventional structure as shown in FIG. 14B, the second base insulating layer 51b, the gate insulating layer 53 and the insulating film (hydrogenated film) 72 and the interlayer insulating layer 409 are also provided in a light path through which light generated in the light emitting element 93 is emitted.

As shown in FIG. 14B, when the plural layers exist in the light path through which light generated in the light emitting element 93 is emitted, a large amount of light is reflected so that a probability of causing a standing wave is increased. Therefore, a possibility of causing large variation in emission spectrum depending on an angle for seeing a surface through which light is emitted is increased.

Embodiment Mode 6

A method for manufacturing a light emitting device according to the present invention as shown in Embodiment Mode 1 will be described in the present embodiment mode with reference to FIGS. 7A to 7E and FIGS. 8A to 8C.

Figure 7A:
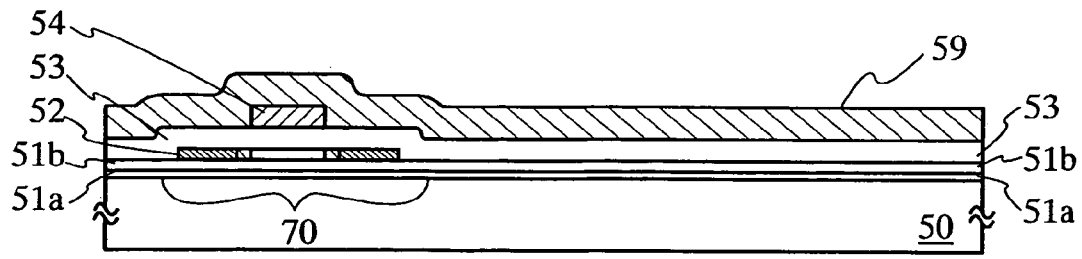
FIGS. 7A to 7E are cross sectional views showing manufacturing processes of a light emitting device according to the invention.

The first base insulating layer 51a and the second base insulating layer 51b are formed over a substrate 50. Thereafter, the semiconductor layer 52 is formed on the second base insulating layer 51b (FIG. 7A).

As a material for the substrate 50, transparent glass, quartz, plastic (e.g., polyimide, acrylic, polyethylene terephthalate, polycarbonate, polyacrylate, polyether sulfone and the like), or the like can be employed. These materials may be polished by CMP etc. to be used as the substrate 50, if necessary. In this embodiment mode, a glass substrate is used.

The first base insulating layer 51a and the second base insulating layer 51b are formed to prevent an element contained in the substrate 50, which adversely affects the characteristics of a semiconductor film, such as alkali metal and alkali earth metal from intruding into the semiconductor layer. As materials for the first and second base insulating layers, silicon oxide, silicon nitride, silicon oxide containing nitrogen, silicon nitride containing oxygen, and the like can be used.

As mentioned above, the first and second base insulating layers 51a and 51b are provided to prevent an impurity element (ion) contained in the substrate 50, which adversely affects the characteristics of the semiconductor layer, such as alkali metal and alkali earth metal from intruding into the semiconductor layer. It is known that a film mainly containing silicon nitride has an excellent effect of blocking the impurity element (ion). However, increasing the amount of silicon nitride contained in the film mainly containing silicon nitride increases the trap level of the film mainly containing silicon nitride and the internal stress thereof. Therefore, it is unsuitable that an active layer of a thin film transistor is directly formed on the film mainly containing silicon nitride. On the other hand, a film mainly containing silicon oxide has advantages of a wider band gap, a better electronic isolation property and a lower trap level as compared with the film mainly containing silicon nitride. However, the film mainly containing silicon oxide also has drawbacks of a stronger hygroscopic property and a lesser effect of blocking the impurity element (ion) as compared with the film mainly containing silicon nitride.

Therefore, in the present embodiment mode, a base insulating layer includes two layers of the first base insulating layer 51a and the second base insulating layer 51b, which is laminated on the first base insulating layer. Concretely, the first base insulating layer 51a is made from silicon nitride containing oxygen with a thickness of 50 nm and the second base insulating layer 51b is made from silicon oxide containing nitrogen with a thickness of 100 nm so that an extraordinary effect of blocking the impurity element (ion) and the reliability of the thin film transistor can simultaneously be obtained.

Next, an amorphous silicon film is crystallized by laser crystallization to form the semiconductor layer in this embodiment mode. Concretely, the amorphous silicon film is formed to have a thickness of 25 to 100 nm (preferably, 30 to 60 nm) on the second base insulating layer 51b. As a method for manufacturing the amorphous silicon film, a known method, e.g., sputtering, reduced pressure CVD, plasma CVD or the like can be employed. Thereafter, the amorphous silicon film is subjected to a heat treatment at 500° C. for one hour so as to perform dehydrogenation.

Subsequently, the amorphous silicon film is crystallized by using a laser irradiation apparatus to form a crystalline silicon film. In the laser crystallization of the present embodiment mode, an excimer laser is used. Laser beam oscillated from the excimer laser is processed into a linear beam spot by using an optical system and irradiated to the amorphous silicon film so as to obtain the crystalline silicon film. The resultant crystalline silicon film is used as the semiconductor layer.

As other methods for crystallizing the amorphous silicon film, there are a method for crystallizing it by only a heat treatment, a method for crystallizing it by a heat treatment using a catalytic element that promotes crystallization, and the like. As the catalytic element for promoting the crystallization, nickel, iron, palladium, tin, zinc, cobalt, platinum, copper, gold and the like can be cited. By using these elements, the crystallization is performed at a lower temperature and for a shorter time as compared with the case of carrying out the crystallization only by the heat treatment, and therefore, the glass substrate and the like are hardly damaged by the crystallization. When the crystallization is performed only by the heat treatment, a high heat resistant substrate such as a quartz substrate or the like must be used as the substrate 50.

To control the threshold value, minute amounts of an impurity is doped to the semiconductor layer, i.e., the channel doping is performed, if necessary. An n-type or a p-type impurity (such as phosphorus and boron) is added to the semiconductor layer by ion doping or the like so as to obtain a predetermined threshold value.

Thereafter, as shown in FIG. 7A, the semiconductor layer is patterned into a predetermined shape to form an island-like semiconductor layer 52. Concretely, photoresist is applied to the semiconductor layer, the photoresist is exposed and baked into a predetermined mask shape to form a resist mask on the semiconductor layer, and the semiconductor layer is etched by utilizing the resist mask so as to perform the patterning.

Subsequently, the gate insulating layer 53 is formed to cover the semiconductor layer 52. The gate insulating layer 53 is made from an insulating layer containing silicon to have a thickness of 40 to 150 nm by plasma CVD or sputtering. In this embodiment mode, silicon oxide is used to form the gate insulating layer 53.

Next, the gate electrode 54 is formed on the gate insulating layer 53. The gate electrode 54 may be made from an element selected from Ta, W, Ti, Mo, Al, Cu, Cr and Nd or an alloy material or a compound material mainly containing these elements. Also, a semiconductor film typified by a polycrystalline silicon film doped with an impurity element such as phosphorus may be used. Alternatively, AgPdCu alloy may be used.

Although the gate electrode 54 is formed to have a single layer in this embodiment mode, the gate electrode 54 may include two or more laminated layers, e.g., tungsten for a lower layer and molybdenum for an upper layer. When the gate electrode with the lamination structure is formed, the above-mentioned materials may be used. Also, the combination of these materials may arbitrarily be selected.

The gate electrode 54 is processed by etching with use of a mask made from photoresist.

Subsequently, a high concentration impurity is added to the semiconductor layer 52 by utilizing the gate electrode 54 as a mask so that the thin film transistor 70 including the semiconductor layer 52, the gate insulating layer 53 and the gate electrode 54 is formed.

Further, the steps for manufacturing the thin film transistor is not particularly limited, and may be changed arbitrarily such that a transistor with a predetermined structure can be fabricated.

A top gate type thin film transistor using the crystalline silicon film, which is crystallized by using the laser crystallization, is used for a pixel portion in this embodiment mode. Alternatively, a bottom gate type thin film transistor using an amorphous semiconductor film can be used for a pixel portion. In addition to silicon, germanium can be used as amorphous semiconductor. When using germanium, the concentration of germanium in the amorphous semiconductor film is preferably set to be about 0.01 to 4.5 atomic %.

Additionally, a microcrystalline semiconductor (semiamorphous semiconductor) film, in which 0.5 to 20 nm crystal grains can be observed, may be used. A fine crystal in which 0.5 to 20 nm crystal grains are observed is also referred to as a so-called microcrystal (μc).

A semiamorphous silicon (also denoted by SAS), which is the semiamorphous semiconductor, can be formed by glow discharge decomposition with silicide gas. As a representative silicide gas, $SiH_4$ is cited. In addition, $Si_2H_6$, $SiH_2Cl_2$, $SiHCl_3$, $SiCl_4$, $SiF_4$ and the like can be used. The SAS can be easily formed by diluting the silicide gas with hydrogen or a mixture of hydrogen and one or more rare gas elements selected from helium, argon, krypton and neon. The dilution ratio is preferably set to be in the range of 1:10 to 1:1,000. The reactive generation of a subject film by the glow discharge decomposition may be performed at a pressure in the range of 0.1 to 133 Pa. The high frequency power for glow discharge may be set to be 1 to 120 MHz, preferably 13 to 60 MHz. The substrate heating temperature may be set to be 300° C. or less, preferably 100 to 250° C.

Raman spectrum of the thus-formed SAS is shifted to lower wavenumbers than 520 $cm^{-1}$. The diffraction peaks of (111) and (220), which are believed to be originated in a Si crystal lattice, are observed in the SAS by X-ray diffraction. Further, the SAS is added with hydrogen or halogen of at least 1 atomic % as a neutralizing agent for dangling bonds. With respect to impurity elements contained in the film, each concentration of impurities for atmospheric constituents such as oxygen, nitrogen and carbon is preferably set to be $1×10^{20}$ $cm^{-1}$ or less. In particular, the oxygen concentration is set to be $5×10^{19}/cm^3$ or less, more preferably, $1×10^{19}/cm^3$ or less. The electric field effect mobility μ is in the range of 1 to 10 $cm^2/Vsec$.

In addition, the SAS may be further crystallized by laser beam.

Subsequently, the insulating film (hydrogenated film) 59 is made from silicon nitride to cover the gate electrode 54 and the gate insulating layer 53. The insulating film (hydrogenated film) 59 is subjected to a heat treatment at 480° C. for about one hour to activate the impurity element and hydrogenate the semiconductor layer 52.

Figure 7B:
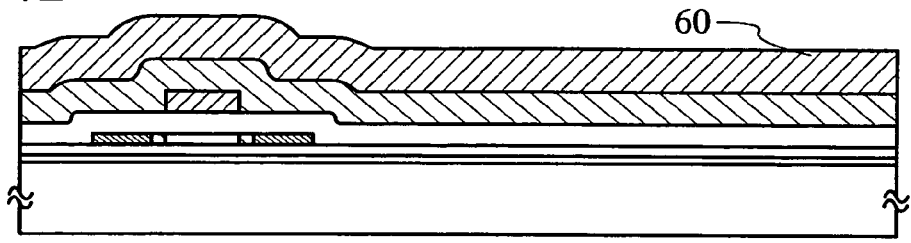

The first interlayer insulating layer 60 is formed to cover the insulating film (hydrogenated film) 59. As a material for forming the first interlayer insulating layer 60, silicon oxide, acrylic, polyimide, siloxane, a Low-k material and the like may preferably be used. In this embodiment mode, a silicon oxide film is formed as the first interlayer insulating layer 60 (FIG. 7B).

Figure 7C:
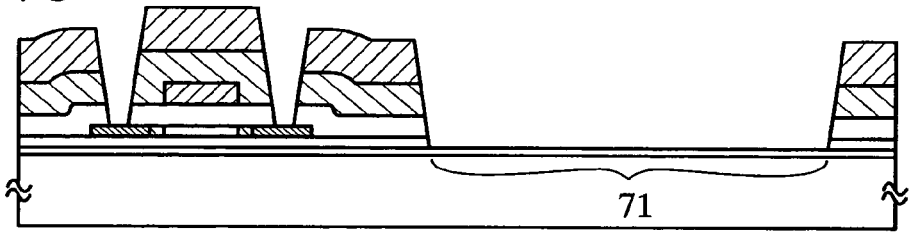

Next, the contact holes reaching the semiconductor layer 52 are formed while the opening 71 is formed in the second base insulating layer 51b, the insulating film (hydrogenated film) 59, the gate insulating layer 53 and the first interlayer insulating layer 60. The contact holes and the opening 71 can be formed by etching with use of a resist mask. Specifically, the contact holes are etched such that the semiconductor layer 52 is exposed, and the opening is etched such that the first base insulating layer 51a is exposed. Either wet etching or dry etching can be employed. In this case, it is important that an etching condition is selected such that an etching rate is low with respect to the materials of the semiconductor layer 52 and the first base insulating layer 51a. Further, the etching may be performed once or in several batches depending on the etching condition. When the etching is carried out in several batches, both the wet etching and the dry etching can be used. For example, the contact holes and the opening may be formed by using a chemical solution using hydrofluoric acid (e.g., 0.5% diluted hydrofluoric acid) by wet etching and the like (FIG. 7C).

Figure 7D:
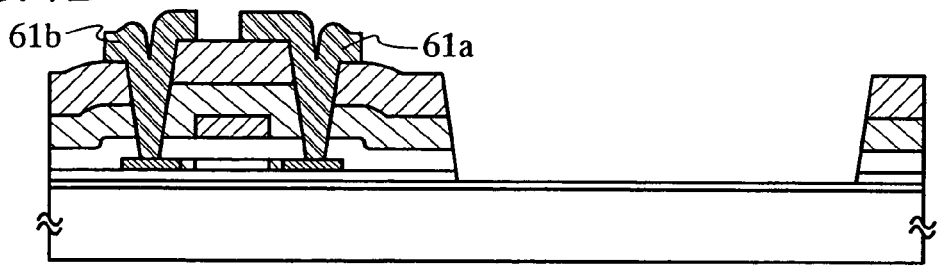

Next, a conductive layer is formed to cover the contact holes and the first interlayer insulating layer 60. The conductive layer is processed into predetermined shapes to form the contact portion 61a, the wiring 61b and the like. These wirings may be formed of a single layer of aluminum, copper or the like. In this embodiment mode, these wirings are formed to have a lamination structure formed by sequentially laminating molybdenum, aluminum and molybdenum over the substrate. In addition, a structure formed by sequentially laminating titanium, aluminum and titanium, a structure formed by sequentially laminating titanium, titanium nitride, aluminum and titanium, or the like may be employed (FIG. 7D).

Figure 7E:
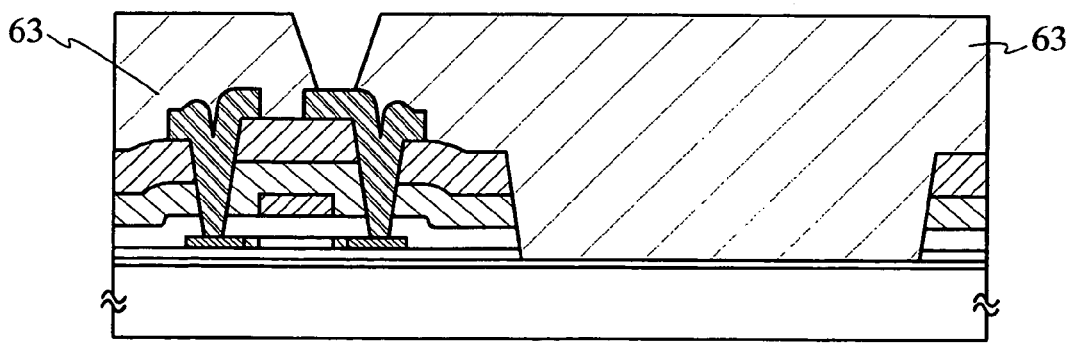

Thereafter, the second interlayer insulating layer 63 is formed to cover the connection portion 61a, the wiring 61b, the first interlayer insulating layer 60 and the opening 71. As the second interlayer insulating layer 63, a film with a self-planarizing property that is formed by applying acrylic, polyimide, siloxane or the like is preferably employed. In this embodiment mode, the second interlayer insulating layer 63 is made from siloxane (FIG. 7E).

Subsequently, an insulating layer may be formed on the second interlayer insulating layer 63 by using silicon nitride or the like. This insulating layer is formed to prevent the second interlayer insulating layer 63 from being excessively etched in etching the pixel electrode that will be formed later. Therefore, when the etching rate ratio of the pixel electrode to the second interlayer insulating layer is high, this insulating layer may not be provided. Next, a contact hole reaching the connection portion 61a through the second interlayer insulating layer 63 is formed.

Figure 8A:
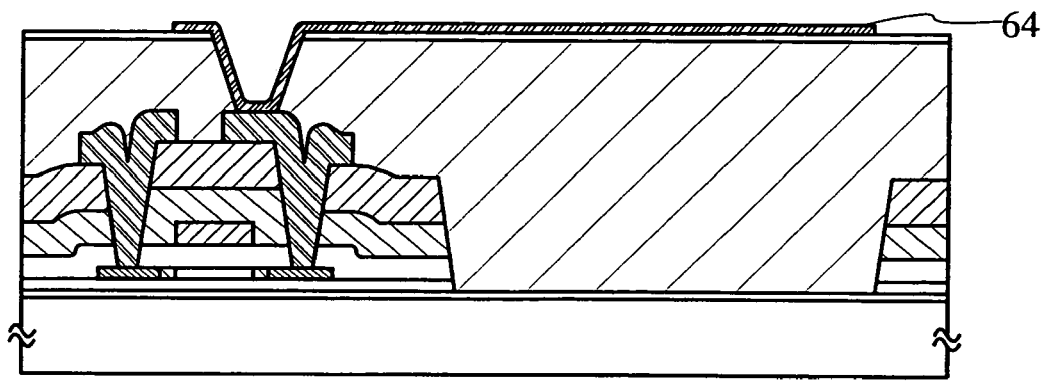
FIGS. 8A to 8C are cross sectional views showing manufacturing processes of a light emitting device according to the invention.

A conductive layer with a light transmitting property is formed to cover the contact hole and the second interlayer insulating layer 63 (or the insulating layer). The conductive layer with the light transmitting property is processed to form the first electrode 64. Here, the first electrode 64 is electrically connected to the connection portion 61a. Also, the first electrode 64 is formed to cover the opening 71. As a material for the first electrode 64, indium tin oxide (ITO), ITO containing silicon oxide (ITSO), IZO (indium zinc oxide) in which 2 to 20% zinc oxide is mixed in indium oxide, zinc oxide, GZO (gallium zinc oxide) in which gallium is mixed in zinc oxide, and the like may be used. In this embodiment mode, the first electrode 64 is made from ITSO (FIG. 8A).

Figure 8B:
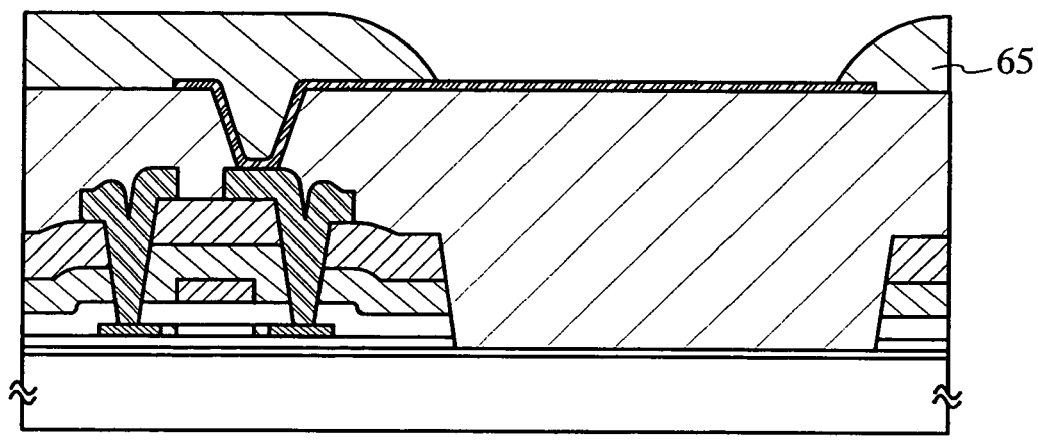

Next, an insulating layer is formed by using an organic or inorganic material to cover the second interlayer insulating layer 63 (or the insulating layer) and the first electrode 64. This insulating layer is processed such that a part of the first electrode is exposed to form the partition wall 65. The partition wall 65 is preferably made from a photosensitive organic material (such as acrylic and polyimide). Alternatively, the partition wall may be made from a nonphotosensitive organic or inorganic material. Preferably, the edge of the partition wall 65 covering the first electrode at the side thereof has a curvature and a tapered shape in which the curvature is continuously varied (FIG. 8B).

Figure 8C:
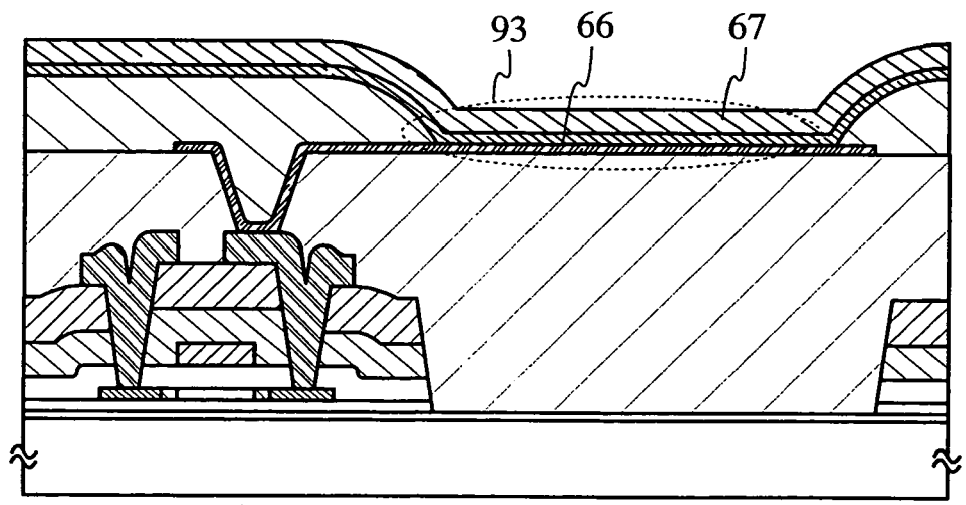

The light emitting layer 66 is next formed to cover the first electrode 64 that is exposed from the partition wall 65. The light emitting layer 66 may be formed by vapor. deposition, the ink-jet method, spin coating or the like (FIG. 8C).

Subsequently, a second electrode 67 is formed to cover the light emitting layer 66. Accordingly, the light emitting element 93 including the first electrode 64, the light emitting layer 66 and the second electrode 67 can be manufactured.

As described above, since the opening 71 is formed in a portion corresponding to a light path through which light generated in the light emitting element 93 is emitted, the number of films through which the light is emitted to the outside of the display device can be reduced. As a result, a probability of causing a standing wave due to the multiple interference of light generated in the light emitting element 93 can be reduced significantly.

According to the present invention, the base insulating layer includes the two layers of the first base insulating layer 51a made from a material mainly containing silicon nitride with an excellent effect of blocking an impurity from the substrate; and the second base insulating layer 51b made from a material mainly containing silicon oxide with a wide band gap, an excellent electronic isolation property and a low trap level. The semiconductor layer 52, which serves as the active layer of the thin film transistor, is formed in contact with the second base insulating layer 51b that is made from the material mainly containing silicon oxide. In order to prevent generation of a standing wave due to the multiple interference of light, the first interlayer insulating layer 60, the insulating film (hydrogenated film) 59, the gate insulating layer 53 and the second base insulating layer 51b are partly removed to form the opening 71, whereas the first base insulating layer 51a, which is made from the material mainly containing silicon nitride with the excellent effect of blocking the impurity from the substrate, remains on the substrate. This can effectively block the ingress of the impurity from the substrate in the display device in which the probability of causing the standing wave and the viewing angle dependency are reduced, thereby maintaining the characteristics of the thin film transistor.

Afterward, a silicon oxide film containing nitrogen is formed by plasma CVD as a passivation film. When using the silicon oxide film containing nitrogen, a silicon oxynitride film formed of $SiH_4$, $N_2O$ and $NH_3$ by plasma CVD, a silicon oxynitride film formed of $SiH_4$ and $N_2O$, or a silicon oxynitride film formed by using a gas in which $SiH_4$ and $N_2O$ is diluted with Ar may be formed.

As the passivation film, a hydrogenated silicon oxynitride film formed using $SiH_4$, $N_2O$ and $H_2$ may be employed. Of course, the passivation film is not limited to the single layer structure. The passivation film may comprise a single layer structure or a lamination structure including other insulating layer that contains silicon. Alternatively, a multilayer film including a carbon nitride film and a silicon nitride film, a multilayer film of styrene polymer, a silicon nitride film, or a diamond like carbon film may be formed as substitute for the silicon oxide film containing nitrogen.

Subsequently, the display portion is sealed to protect the light emitting element (the electroluminescent element) from a substance that promotes the deterioration of the light emitting element such as moisture. When a counter substrate is used for sealing the display portion, the counter substrate is attached to the substrate (the element substrate) with a sealing material having an electronic isolation property such that an external connection portion is exposed. A space between the counter substrate and the substrate may be filled with an inert gas such as dried nitrogen. Alternatively, the sealing material may be applied to the entire surface of the pixel portion to form a counter substrate. Ultraviolet curing resin or the like is preferably used as the sealing material. A desiccant or a particle for maintaining a constant gap between the substrates may be mixed in the sealing material. Subsequently, a flexible wiring substrate is attached to the external connection portion, thereby completing a light emitting device (an electroluminescent device).

Further, a light emitting device (a light emitting display device) according to the present invention with a display function may employ either analog video signals or digital video signals. Light emitting display devices using the digital video signals are classified into one in which a voltage is used as the video signals and one in which a current is used as the video signals. When light emitting elements emit light, video signals input in pixels are classified into one at a constant voltage and one at a constant current. Moreover, the video signals at a constant voltage include one in which a constant voltage is applied to a light emitting element and one in which a constant current flows through a light emitting element. The video signals at a constant current include one in which a constant voltage is applied to a light emitting element and one in which a constant current flows through a light emitting element. The case where a constant voltage is applied to a light emitting element indicates a constant voltage drive whereas the case where a constant current flows through a light emitting element indicates a constant current drive. In the constant current drive, a constant current flows regardless of the change in resistance of a light emitting element. The light emitting display device of the invention and a method for manufacturing thereof may use either the driving method utilizing a voltage of video signals or a driving method using a current of video signals. Furthermore, either the constant voltage drive or the constant current drive may be employed.

With respect to the display device manufactured according to the present embodiment mode, the number of films (the number of interfaces) existing in the light path through which light generated in the light emitting element 93 is emitted to the outside of the display device can be reduced. This allows to reduce the reflection of light in an interface of the films and the probability of causing a standing wave due to the multiple interference. Consequently, the viewing angle dependency of the display device can be reduced. Furthermore, since the first base insulating layer 51a, which is made from the material mainly containing silicon nitride with the excellent effect of blocking an impurity from the substrate, remains in the opening, the ingress of an impurity from the substrate can be effectively blocked, thereby maintaining the characteristics of the thin film transistor.

Furthermore, the other structures of the present invention as shown in FIG. 1 to FIG. 6C can be easily obtained by arbitrarily changing the manufacturing processes described in this embodiment mode by a person skilled in the art.

Embodiment Mode 7

Figure 12A:
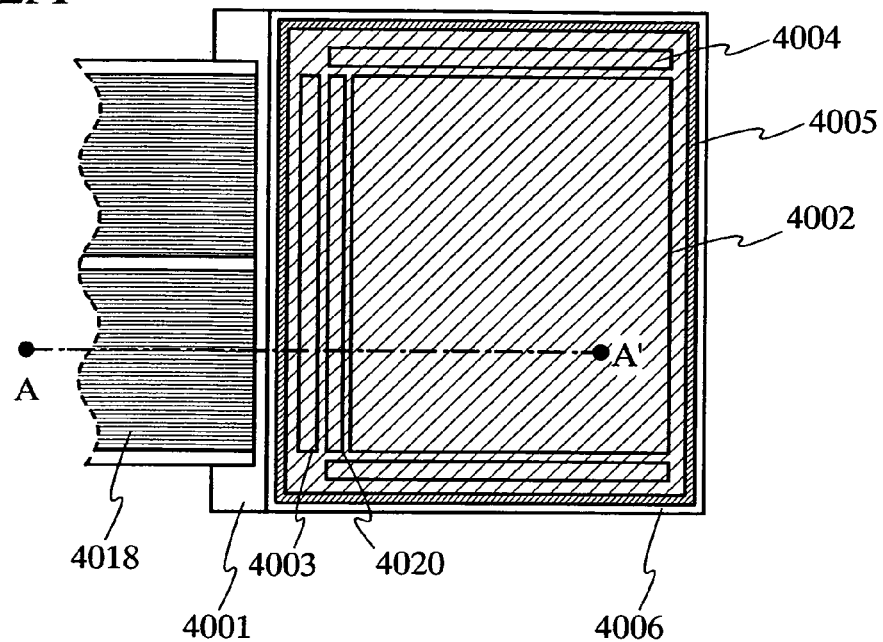
FIG. 12A is a top view of a light emitting device according to the invention and FIG. 12B is a cross sectional view thereof.
Figure 12B:
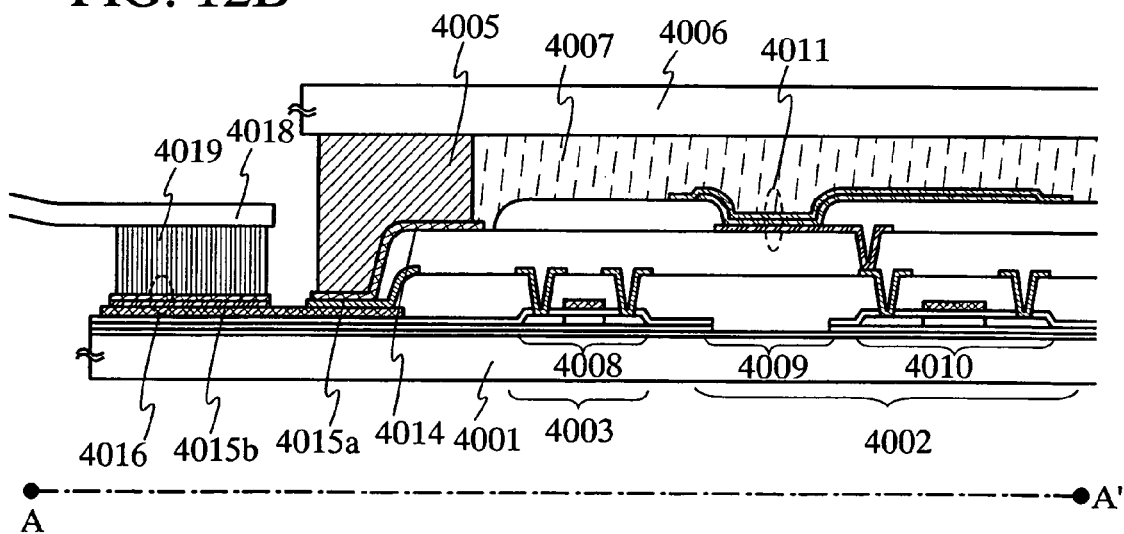

An exterior appearance of a panel for a light emitting device corresponding to one mode of the invention will be described in this embodiment mode with reference to FIGS. 12A and 12B. FIG. 12A is a top view of the panel in which a transistor and a light emitting element formed over a substrate 4001 are sealed with a sealing material that is provided between the substrate 4001 and a counter substrate 4006. FIG. 12B corresponds to a cross sectional view of FIG. 12A.

A sealing material 4005 is provided to surround a pixel portion 4002, a signal line driver circuit 4003 and a scanning line driver circuit 4004 each of which are provided over the substrate 4001. The counter substrate 4006 is provided over the pixel portion 4002, the signal line deriver circuit 4003 and the scanning line driver circuit 4004. The pixel portion 4002, the signal line driver circuit 4003 and the scanning line driver circuit 4004 are hermetically sealed with the substrate 4001, the sealing material 4005 and the counter substrate 4006 together with a filler 4007.

The pixel portion 4002, the signal line driver circuit 4003 and the scanning line driver circuit 4004 provided over the substrate 4001 comprise a plurality of thin film transistors. A thin film transistor 4008 included in the signal line driver circuit 4003 and a thin film transistor 4010 included in the pixel portion 4002 are depicted in FIG. 12B.

Further, reference numeral 4011 corresponds to a light emitting element that is electrically connected to the thin film transistor 4010. An opening 4009 is provided between the substrate 4001 and the light emitting element. Therefore, when light generated in the light emitting element is emitted to the outside of the display device, materials having refractive indices that are largely different from one another are not formed in a light path. Refer to Embodiment Modes 1 through 6 for more information about the opening 4009.

Also, a leading wiring 4014 serves to supply signals or a power supply voltage to the pixel portion 4002, the signal line driver circuit 4003 and the scanning line driver circuit 4004. The leading wiring 4014 is connected to a connection terminal 4016 through a leading wiring 4015a and a leading wiring 4015b. The connection terminal 4016 is electrically connected to a terminal of a flexible printed circuit (FPC) through an anisotropic conductive film 4019.

As the filler 4007, an inert gas such as nitrogen and argon, ultraviolet curing resin, and heat curing resin can be used.

Also, polyvinyl chloride, acrylic, polyimide, epoxy resin, silicon resin, polyvinyl butyral, or ethylene vinylene acetate can be employed.

Further, a panel formed with a pixel portion having a light emitting element and a module in which an IC is mounted on the panel are included in a category of the display device of the invention.

With respect to a panel and a module each having the structure of the present embodiment mode, the number of films (the number of interfaces) existing in the light path through which light generated in the light emitting element 93 is emitted to the outside of the display device can be reduced. This allows to reduce the reflection of light in an interface of the films and the probability of causing a standing wave due to the multiple interference. Consequently, the viewing angle dependency of the display device can be reduced. Furthermore, since the first base insulating layer 51a, which is made from the material mainly containing silicon nitride with the excellent effect of blocking an impurity from the substrate, remains in the opening, the ingress of an impurity through the substrate can be effectively blocked, thereby maintaining the characteristic of the thin film transistor.

Embodiment Mode 8

As an electronic appliance of the present invention mounted with a module as shown in Embodiment Mode 7, the following electronic appliances can be cited: a camera such as a video camera and a digital camera; a goggle type display (a head mounted display); a navigation system; an audio reproduction device (such as a car audio component system); a computer; a game machine; a portable information terminal (such as a mobile computer, a cellular phone, a portable game machine and an electronic book); an image reproduction device provided with a recording medium (typically, a device which can reproduce the recording medium such as a digital versatile disc (DVD) and display images thereof); and the like. Specific examples of these electronic appliances are shown in FIGS. 13A to 13E.

Figure 13A:
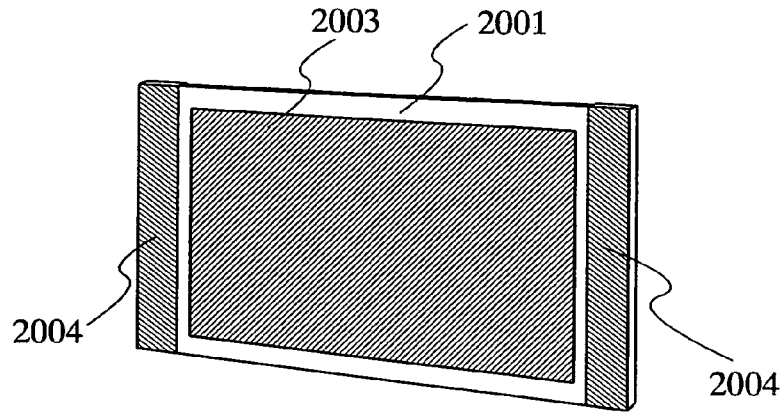
FIGS. 13A to 13E are diagrams showing examples of electronic appliances to which the present invention can be applied.

FIG. 13A is a light emitting display device, which corresponds to a monitor of a television, a personal computer or the like. The light emitting display device includes a housing 2001, a display portion 2003, speaker portions 2004 and the like. In the light emitting display device of the present invention, the variation in emission spectrum depending on an angle for seeing a light extraction surface of the display portion 2003 is reduced, thereby improving the quality of a display. In order to increase the contrast, a pixel portion may be provided with a polarizing plate or a circular polarizing plate. For example, it is preferable that a $\frac{1}{4}\lambda$ plate, a $\frac{1}{2}\lambda$ plate and a polarizing plate be sequentially laminated on a substrate. In addition, an antireflection film may be provided on the polarizing plate.

Figure 13B:
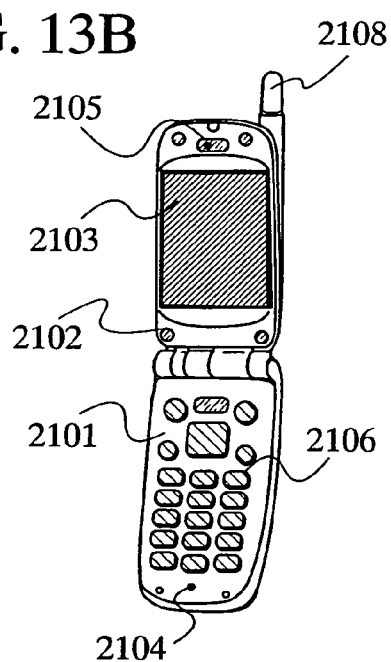

FIG. 13B shows a cellular phone, including a main body 2101, a housing 2102, a display portion 2103, an audio input portion 2104, an audio output portion 2105, operation keys 2106, an antenna 2108 and the like. In the cellular phone of the present invention, the variation in emission spectrum depending on an angle for seeing a light extraction surface of the display portion 2103 is reduced, thereby improving the quality of a display.

Figure 13C:
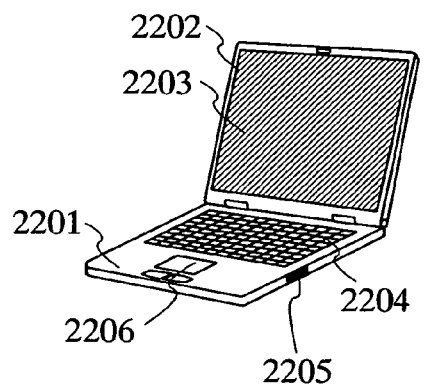

FIG. 13C shows a laptop computer, including a main body 2201, a housing 2202, a display portion 2203, a keyboard 2204, an external connection port 2205, a pointing mouse 2206 and the like. In the laptop computer of the present invention, the variation in emission spectrum depending on an angle for seeing a light extraction surface of the display portion 2203 is reduced, thereby improving the quality of a display. Although the laptop computer is shown in FIG. 13C, the present invention can be applied to a desktop computer in which a hard disk is formed integral with a display portion and the like.

Figure 13D:
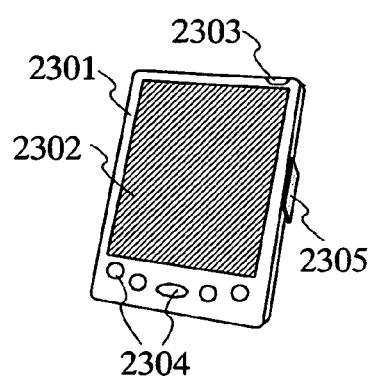

FIG. 13D shows a mobile computer, including a main body 2301, a display portion 2302, a switch 2303, operation keys 2304, an infrared port 2305 and the like. In the mobile computer of the present invention, the variation in emission spectrum depending on an angle for seeing a light extraction surface of the display portion 2302 is reduced, thereby improving the quality of a display.

Figure 13E:
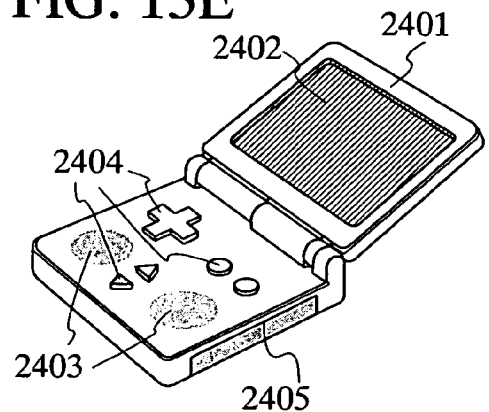

FIG. 13E shows a portable game machine, including a housing 2401, a display portion 2402, speaker portions 2403, operation keys 2404, a recording medium insert portion 2405 and the like. In the mobile computer of the present invention, the variation in emission spectrum depending on an angle for seeing a light extraction surface of the display portion 2402 is reduced, thereby improving the quality of a display.

As set forth above, the application range of the present invention is extremely wide and the invention can be applied to electronic appliances in various fields.

Embodiment Mode 9

The present embodiment will describe a structure of the light emitting layer 66 in more detail.

A light emitting layer is formed of a charge injecting/transporting substance containing an organic compound or an inorganic compound and a light emitting material. The light emitting layer includes one or plural kinds of layers selected from a low molecular weight organic compound, an intermediate molecular weight organic compound (which indicates an organic compound that does not sublimate and has 20 or less molecules or a chained molecule with a length of 10 μm or less) and a high molecular weight organic compound depending on the number of its molecules. The light emitting layer may be formed in combination with an inorganic compound having an electron injecting/transporting property or a hole injecting/transporting property.

With respect to substances with excellent electron transporting properties among the charge injecting/transporting substances, for example, metal complexes having quinoline skeleton or benzoquinoline skeleton such as tris(8-quinolinolate)aluminum (abbreviation: $Alq_3$); tris(5-methyl-8-quinolinolate)aluminum (abbreviation: $Almq_3$); bis(10-hydroxybenzo[h]quinolinato)beryllium (abbreviation: $BeBq_2$); and bis(2-methyl-8-quinolinolate)-4-phenylphenolate-aluminum (abbreviation: BAlq) can be given. As substances having superior hole transporting properties, for example, the following aromatic amine (i.e., one having a benzene ring-nitrogen bond) compounds can be cited: 4,4'-bis(N-(1-naphthyl)-N-phenyl-amino)-biphenyl (abbreviation: α-NPD); 4,4'-bis (N-(3-methylphenyl)-N-phenyl-amino)-biphenyl (abbreviation: TPD); 4,4',4"-tris(N,N-diphenyl-amino)-triphenylamine (abbreviation: TDATA); and 4,4',4"-tris(N-(3-methylphenyl)-N-phenyl-amino)-triphenylamine (abbreviation: MTDATA).

With respect to substances having extremely superior electron injecting properties among the charge injecting/transporting substances, compounds of alkali metal or alkali earth metal such as lithium fluoride (LiF), cesium fluoride (CsF) and calcium fluoride ($CaF_2$) can be cited. In addition, a mixture of a substance having a high electron transportation property such as $Alq_3$ and alkali earth metal such as magnesium (Mg) may be used.

With respect to substances having superior hole injecting properties among the charge injecting/transporting substances, for example, the following substances can be cited: metal oxide such as molybdenum oxide (MoOx), vanadium oxide (VOx), ruthenium oxide (RuOx), tungsten oxide (WOx) and manganese oxide (MnOx). Besides, phthalocyanine based compounds such as phthalocyanine (abbreviation: $H_2Pc$) and copper phthalocyanine (CuPc) can be mentioned.

Light emitting layers having different light emitting wavelength bands may be formed in each pixel so as to perform color display. Typically, light emitting layers corresponding to respective colors of R (red), G (green) and B (blue) are formed. In this case, when a filter (a colored layer) that transmits lights of the wavelength bands is provided at a side of light emission of pixels, color purity can be improved and specular reflexion (reflection) of a pixel portion can be prevented. By providing the filter (colored layer), a circular polarizing plat or the like, which has conventionally been used to prevent the specular reflexion (reflection) of the pixel portion, can be eliminated. Therefore, loss of light generated in the light emitting layers can be eliminated. Also, change in color tone, that is caused in the case where a pixel portion (a display screen) is seen obliquely, can be reduced.

There are various kinds of light emitting materials. With respect to low molecular weight organic light emitting materials, the following substances can be used: 4-dicyanomethylene-2-methyl-6-[2-(1,1,7,7-tetramethyljulolidine-9-yl) ethenyl]-4H-pyran (abbreviation: DCJT); 4-dicyanomethylene-2-t-butyl-6-[2-(1,1,7,7-tetramethyljulolidine-9-yl)ethenyl]-4H-pyran (abbreviation: DCJTB); periflanthene; 2,5-dicyano-1,4-bis(10-methoxy-1,1,7,7-tetramethyl-julolidyl-9-enyl)benzene, N,N'-dimethylquinacridone (abbreviation: DMQd); coumarin 6; coumarin 545T; tris(8-quinolinolate)aluminum (abbreviation: $Alq_3$); 9,9'-biantryl; 9,10-diphenylanthracene (abbreviation: DPA); 9,10-bis(2-naphthyl)anthracene (abbreviation: DNA); and the like. Also, another substances may be used.

On the other hand, as compared with the low molecular weight organic light emitting materials, the high molecular weight organic light emitting materials have higher physical strength, which results in more durable elements. In addition, since the high molecular weight organic light emitting materials can be formed by applying a liquid, an element can be formed relatively easily. A structure of a light emitting element made from the high molecular weight organic light emitting material is basically similar to that of using the low molecular weight organic light emitting material, and is formed by sequentially laminating a cathode, an organic light emitting layer and an anode over a substrate. However, when a light emitting layer is made from the high molecular weight organic light emitting material, it is difficult to form the lamination structure like the case of using the low molecular weight organic light emitting material. In many cases, such the light emitting element made from the high molecular weight organic light emitting material has a two layer structure. Concretely, it is a lamination structure formed by sequentially laminating a cathode, a light emitting layer, a hole transporting layer and an anode.

A luminescent color is determined by a material for forming a light emitting layer, and hence, a light emitting element that emits light of a predetermined color can be formed by selecting the material. As high molecular weight light emitting materials (high molecular weight electroluminescent materials) that can be used to form a light emitting layer, polyparaphenylene vinylene, polyparaphenylene, polythiophene, polyfluorene and the like can be mentioned.

Specifically, the following substances can be cited as polyparaphenylene vinylene: a derivative of poly(paraphenylenevinylene) (PPV); poly(2,5-dialkoxy-1,4-phenyenevinylene) (RO-PPV); poly(2-[2'-ethyl-hexoxy]-5-methoxy-1,4-phenylenevinylene) (MEH-PPV); poly(2-[dialkoxyphenyl]-1,4-phenylenevinylene) (ROPh-PPV); and the like. With respect to the polyparaphenylene, the following substances can be cited: a derivative of polyparaphenylene (PPP); poly(2,5-dialkoxy-1,4-phenylene) (RO-PPP); poly(2,5-dihexoxy-1,4-phenylene); and the like. With respect to the polythiophene, the following substances can be mentioned: a derivative of polythiophene (PT); poly(3-alkylthiophene) (PAT); poly(3-hexylthiophene) (PHT); poly(3-cyclohexylthiophene) (PCHT); poly(3-cyclohexyl-4-methylthiophene) (PCHMT); poly(3,4-dicyclohexylthiophene) (PDCHT); poly(3-[4-octylphenyl]-thiophene) (POPT); poly(3-[4-octylphenyl]-2,2-bithiophene) (PTOPT); and the like. With respect to the polyfluorene, the following substances can be cited: a derivative of polyfluorene (PF); poly(9,9-dialkylfluorene) (PDAF); poly(9,9-dioctylfluorene) (PDOF); and the like.

A light emitting layer can emit monochromatic light or white light. In the case of using a white light emitting material, a color display can be achieved by providing a filter (a colored layer) that transmits light of a certain wavelength in a light emitting direction side of a pixel.

In order to form a light emitting layer that emits white light, for example, white light emission can be achieved by sequentially laminating $Alq_3$, $Alq_3$ partially doped with Nile red, which is a red light emitting pigment, $Alq_3$, p-EtTAZ and TPD (aromatic diamine) by using vapor deposition. Also, when a light emitting layer is formed by application using spin coating, the each layer is preferably baked by vacuum heating after forming by applying a liquid. For example, an aqueous solution of poly(ethylene dioxythiophene)/poly(styrenesulfonic acid) (PEDOT/PSS), which functions as a hole injecting layer, may be applied over the entire surface of a substrate and baked. Afterwards, a solution of polyvinyl carbazole (PVK) doped with a pigment for luminescence center (such as 1,1,4,4-tetraphenyl-1,3-butadiene (TPB), 4-dicyanomethylene-2-methyl-6-(p-dimethylamino-styryl)-4H-pyran (DCM1), Nile red and coumarin 6), which serves as a light emitting layer, may then be applied over the entire surface and baked.

A light emitting layer may be formed to have a single layer. In this case, 1,3,4-oxadiazole derivative (PBD) with an electron transporting property may be dispersed in polyvinyl carbazole (PVK) with a hole transporting property. In addition, white light emission can be obtained by dispersing 30 wt % PBD as an electron transporting agent and dispersing a suitable amount of four kinds of pigments (TPB, coumarin 6, DCM1, and Nile red). In addition to the above-mentioned light emitting elements that emit white light, a light emitting element capable of emitting red light, green light or blue light can be manufactured by properly selecting materials for the light emitting layer.

When a high molecular weight organic light emitting material with a hole transporting property is sandwiched between an anode and a high molecular weight organic light emitting material with a light emitting property, the hole injecting properties from the anode can be improved. Typically, a solution in which a high molecular weight organic light emitting material with the hole transporting property is dissolved in water along with an acceptor material is applied by spin coating or the like. Since an organic solvent is insoluble, it can be laminated together with the above-mentioned organic light emitting material with the light emitting property. As the high molecular weight organic light emitting material with the hole transporting property, a mixture of PEDOT and camphor sulfonic acid (CSA) as an acceptor material; a mixture of polyaniline (PANI) and polystyrenesulfonic acid (PSS) as an acceptor material; and the like can be cited.

Further, triplet excited light emitting materials including metal complexes and the like may be used for a light emitting layer in addition to singlet excited light emitting materials. For example, pixels emitting red light in which luminance half-life is relatively short are formed by a triplet excited light emitting material, and pixels emitting green and blue lights are formed of singlet excited light emitting materials. Since the triplet excited light emitting material has excellent light emitting efficiency, it has a feature of requiring lower power consumption in order to obtain a same level of luminance as compared with the singlet excited light emitting material. That is, when the pixels for emitting red light are formed by a triplet excited light emitting material, a small amount of current flowing through the light emitting element is required, thereby improving the reliability. To reduce power consumption, pixels emitting red and green lights may be formed of the triplet excited light emitting materials, while pixels emitting blue light may be formed of a singlet excited light emitting material. In the case where light emitting elements that emit green lights, which has high visibility with respect to human eyes, are also formed of the triplet excited light emitting material, power consumption can be further reduced.

As an example of the triplet excited light emitting material, there is one that uses a metal complex as a dopant. In particular, a metal complex with platinum, which is a third transition element, as its center metal, a metal complex with iridium as its center metal and the like are known. The triplet excited light emitting materials are not limited to these compounds, and it is possible to use a compound having the above mentioned structure and including an element that belongs to groups 8 to 10 of the periodic table as its center metal.

Above mentioned substances for forming the light emitting layer are examples, and a light emitting element can be formed by properly laminating respective layers with various properties such as a hole injecting/transporting layer, a hole transporting layer, an electron injecting/transporting layer, an electron transporting layer, a light emitting layer, an electron blocking layer and a hole blocking layer. In addition, a mixed layer or a mixed junction of these layers may be used. The layer structure of the light emitting layer can be varied, and the light emitting layer can be formed in various forms. The structural change of the light emitting layer may be allowable without deviating the purpose of the invention; for example, an electrode is provided or a light emitting material is dispersed so as to function as a light emitting layer, instead of providing a certain electron injecting region or light emitting region.

When a light emitting element formed of the above-mentioned materials is applied with a forward bias voltage, it can emit light. Each pixel of a display device formed using the light emitting element can be driven by either a simple matrix method or an active matrix method. In either case, each pixel emits light by being applied with a forward bias voltage at a certain timing, whereas each pixel does not emit light in a certain period. In this non-light emitting period, a reverse bias voltage is applied to the light emitting element so that the reliability of the light emitting element can be improved. The light emitting element has deterioration modes of reducing light intensity under a certain drive condition or reducing appearance luminance due to expansion of a non-light emitting region within pixels. When the light emitting element is driven by an AC drive such that each pixel is applied with a forward bias voltage and a reverse bias voltage alternately, the deteriorations of the light emitting element can be hindered, thereby increasing the reliability of the light emitting device.

Embodiment Mode 10

Examples of structures of light emitting devices using the present invention will be described with reference to FIGS. 9A and 9B. Further, the reference numerals used in FIG. 1 are also used for portions exhibiting same functions, and will not be further explained, even if the portions has different shapes. In this embodiment mode, the thin film transistor 70 having an LDD structure is connected to the light emitting element 93 through the connection portion 61*a*. Of course, this arrangement can be applied to the structures as shown in Embodiment Modes 1 to 3.

Figure 9A:
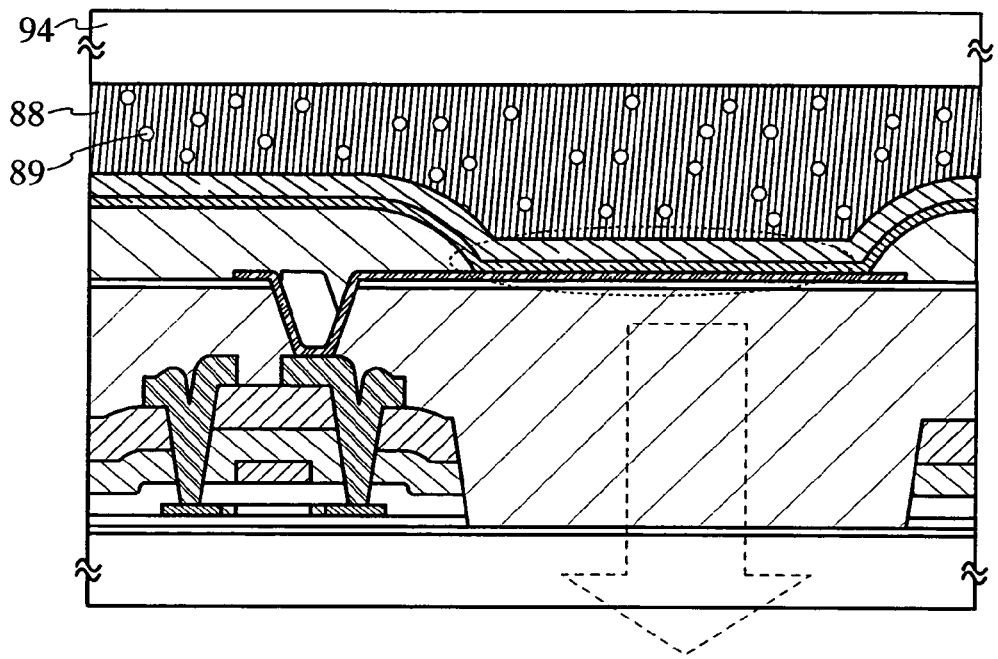
FIGS. 9A and 9B are cross sectional views showing examples of structures for light emitting devices.

FIG. 9A shows a structure in which a first electrode 64 is made from a conductive film with a light transmitting property and light generated in a light emitting layer 66 is emitted through a substrate 50. Reference numeral 94 represents a counter substrate. After forming the light emitting element 93, the counter substrate 94 is attached to the substrate 50 by using a sealing material or the like. Resin 88 with a light transmitting property or the like is filled between the counter substrate 94 and the light emitting element 93 to seal the light emitting element. Accordingly, the light emitting element can be prevented from being deteriorated by moisture. Preferably, the resin 88 has a hygroscopic property. When a drying agent 89 with an excellent light transmitting property is dispersed in the resin 88, an adverse influence of moisture can further be prevented. Therefore, this structure is preferable.

Figure 9B:
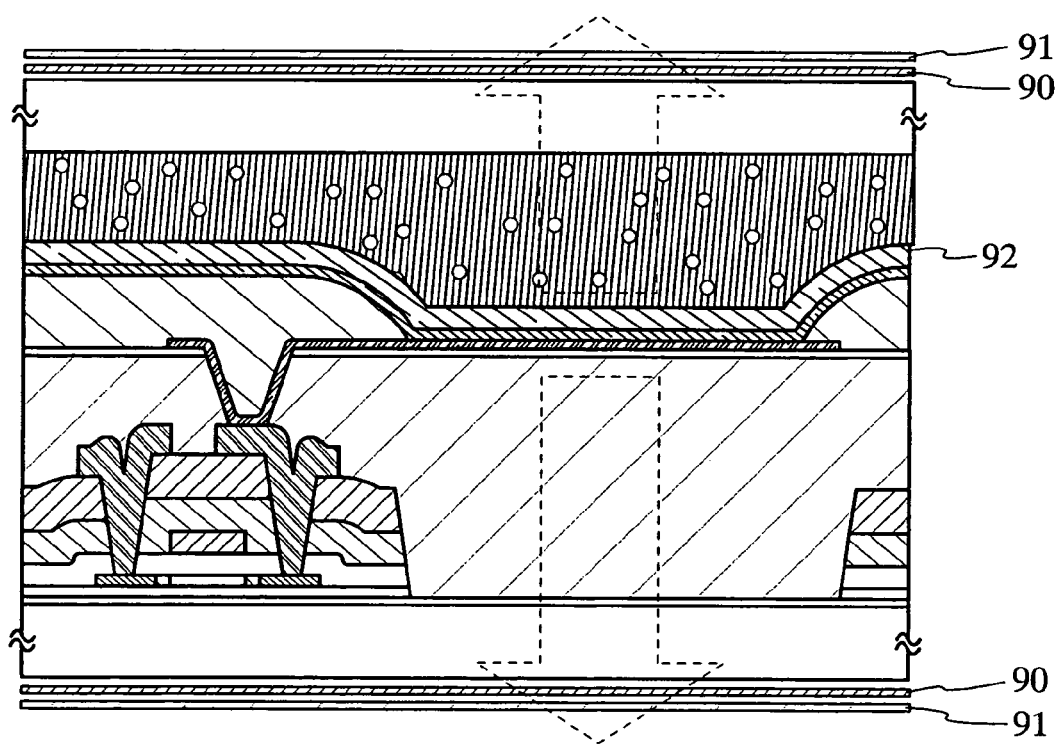

FIG. 9B shows a structure in which a first electrode 64 and a second electrode 92 are made from conductive films with light transmitting properties, and light is emitted through both the substrate 50 and the counter substrate 94. In this structure, polarizing plates 90 are provided outside of the substrate 50 and the counter substrate 94 so that a back surface is prevented from being transparent through a screen. This improves the visibility. Preferably, protection films 91 are provided outside of the respective polarizing plates 90.

According to the present invention, the number of films (the number of interfaces) existing in a light path through which light generated in the light emitting element 93 with the light emitting layer 66 like the present embodiment mode is emitted to the outside of the display device can be reduced, which reduces the reflection of light in an interface of the films and the probability of causing a standing wave due to the multiple interference. Consequently, the viewing angle dependency of the display device can be reduced.

Embodiment Mode 11

In the present embodiment mode, the panels as shown in Embodiment Mode 7, a pixel circuit and a protection circuit of a module, and operations thereof will be described with reference to FIGS. 10A to 10F. Further, the cross sectional views as shown in FIG. 1 to FIG. 9B are cross sectional views of a driving TFT 1403 and a light emitting element 1405.

In a pixel as shown in FIG. 1A, a signal line 1410 and power supply lines 1411 and 1412 are arranged in columns while a scanning line 1414 is arranged in a row. The pixel further includes a switching TFT 1401, a driving TFT 1403, a current controlling TFT 1404, a capacitor element 1402 and a light emitting element 1405.

Figure 10A:
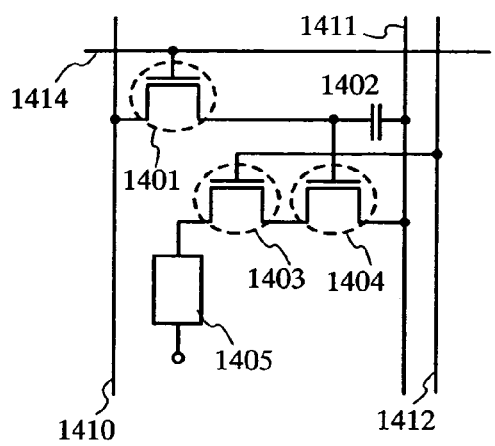
FIGS. 10A to 10F are equivalent circuit diagrams showing examples of pixel circuits for a light emitting device.
Figure 10B:
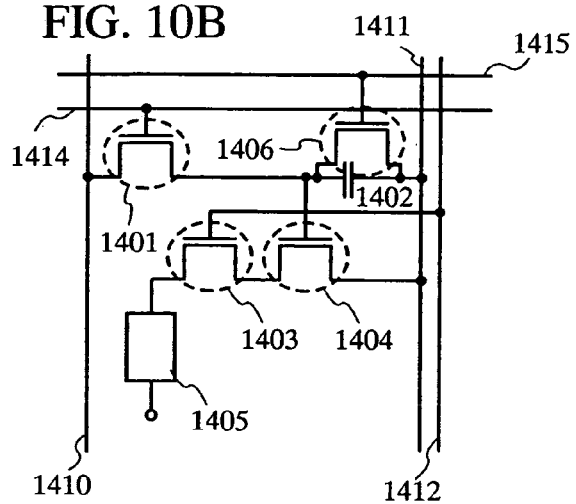
Figure 10C:
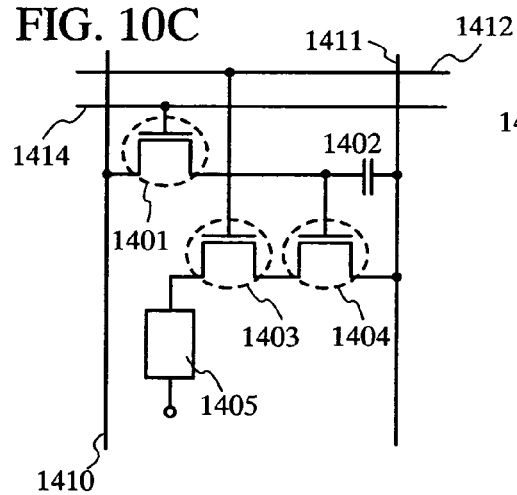

A pixel as shown in FIG. 10C has a similar configuration to the one as shown in FIG. 10A, except that a gate electrode of the driving TFT 1403 is connected to a power supply line 1412 that is arranged in a row. That is, both pixels in FIGS. 10A and 10C show same equivalent circuit diagrams. However, respective power supply lines are formed of conductive films placed in different layers, wherein the power supply line 1412 is arranged in a column (FIG. 10A) and the power supply line 1412 is arranged in a row (FIG. 10C). In order to pay attention to the wirings to which the gate electrodes of respective driving TFTs 1403 are connected and to show the different arrangements of these wirings, the equivalent circuit diagrams are individually illustrated in FIGS. 10A and 10C.

In each pixel as shown in FIGS. 10A and 10C, the driving TFT 1403 and the current controlling TFT 1404 are connected in series with each other. The channel length L (1403) and the channel width W (1403) of the driving TFT 1403 and the channel length L (1404) and the channel width W (1404) of the current controlling TFT 1404 are preferably set to satisfy the following relation: L(1403)/W(1403):L(1404)/W(1404)=5 to 6,000:1.

The driving TFT 1403 is operated in a saturation region and serves to control the amount of current flowing through the light emitting element 1405, whereas the current controlling TFT 1404 is operated in a linear region and serves to control a current supplied to the light emitting element 1405. The both TFTs 1403 and 1404 preferably have a same conductivity type in view of the manufacturing process. In this embodiment mode, n-channel TFTs are used as the TFTs 1403 and 1404. Also, as the driving TFT 1403, a depletion type TFT may be used besides an enhancement type TFT. According to the invention having the above configuration, slight variation in Vgs of the current controlling TFT 1404 does not adversely affect the amount of current flowing through the light emitting element 1405, since the current controlling TFT 1404 is operated in the linear region. That is, the amount of current flowing through the light emitting element 1405 can be determined by the driving TFT 1403 operated in the saturation region. Accordingly, it is possible to provide a display device in which image quality is improved by improving the variation in luminance of the light emitting element due to the variation of the characteristics of the TFT.

The switching TFTs 1401 of the respective pixels as shown in FIGS. 10A and 10C control input of video signals to each pixel. When the switching TFT 1401 is turned ON, a video signal is inputted to the pixel so that a voltage of the video signal is stored in the capacitor element 1402. Although the configurations in which the respective pixels include the capacitor elements 1402 are shown in FIGS. 10A and 10C, the invention is not limited thereto. When a gate capacitor or the like can also serve as a capacitor for holding a video signal, the capacitor element 1402 may not be provided.

Figure 10D:
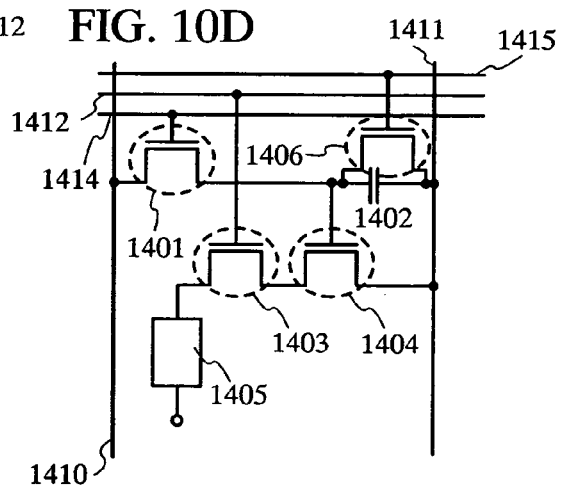

A pixel as shown in FIG. 10B has a similar configuration to the one shown in FIG. 10A, except that a TFT 1406 and a scanning line 1414 are added thereto. Similarly, a pixel as shown in FIG. 10D has a similar configuration to the one shown in FIG. 10C, except that a TFT 1406 and a scanning line 1414 are added thereto.

The TFT 1406 is controlled to be turned ON/OFF by the newly provided scanning line 1414. When the TFT 1406 is turned ON, charges held in the capacitor element 1402 are discharged, thereby turning the current controlling TFT 1404 OFF. That is, supply of a current to the light emitting element 1405 can be forcibly stopped by providing the TFT 1406. The TFT 1406 can, thus, be referred to as an erasing TFT. Therefore, a lighting period can start simultaneously with or immediately after a writing period starts before signals are written in all the pixels according to the configurations as shown in FIGS. 10B and 10D, and hence, the duty ratio can be improved.

Figure 10E:
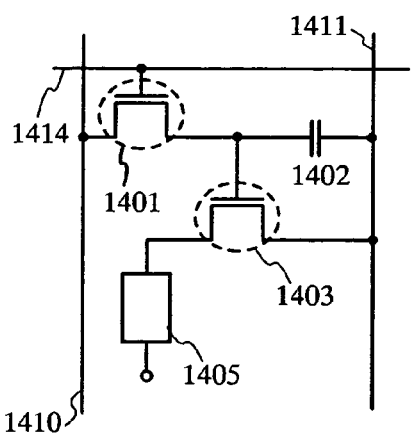
Figure 10F:
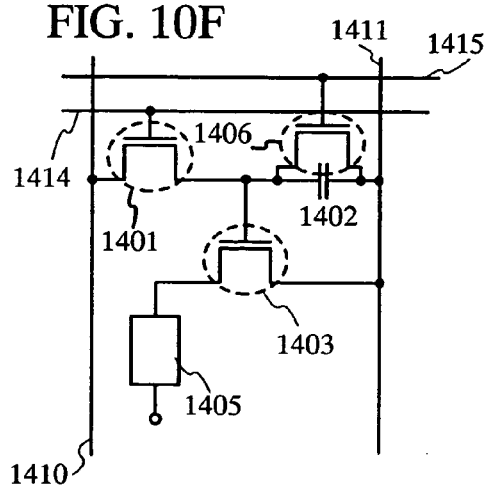

In a pixel as shown in FIG. 10E, a signal line 1410 and a power supply line 1411 are arranged in columns, and a scanning line 1414 is arranged in a row. The pixel further includes a switching TFT 1401, a driving TFT 1403, a capacitor element 1402 and a light emitting element 1405. A pixel as shown in FIG. 10F has a similar configuration to the one as shown in FIG. 10E, except that a TFT 1406 and a scanning line 1415 are added thereto. Further, the configuration as showns in FIG. 10F also allows a duty ratio to be improved by providing the TFT 1406.

As set forth above, various types of pixel circuits can be employed. In particular, when a thin film transistor is made from an amorphous semiconductor film, a semiconductor film of a driving TFT is preferably made larger. Therefore, a top-emission type light emitting device in which light generated in a light emitting layer (an electroluminescent layer) is emitted through a counter substrate is preferably formed using the foregoing pixel circuits.

When the pixel density is increased in such an active matrix light emitting device, the device can be driven at a low voltage since TFTs are formed in each pixel. Therefore, the active matrix light emitting device is advantageous.

Although the active matrix light emitting device in which TFTs are provided in each pixel is described in this embodiment mode, a passive matrix light emitting device in which TFTs are provided in each column can also be fabricated. Since the TFTs are not formed in each pixel in the passive matrix light emitting device, a high aperture ratio can be achieved. In the case of a passive matrix type light emitting device in which light is emitted toward both sides of a light emitting layer, the light transmittance is improved.

A display device of the invention including such the pixel circuit can exhibit an excellent viewing angle dependency and maintain characteristics of the thin film transistor so that the display device has various advantages.

Subsequently, a case in which diodes are formed as protection circuits in a scanning line and a signal line will be described using the equivalent circuit as shown in FIG. 10E.

Figure 11:
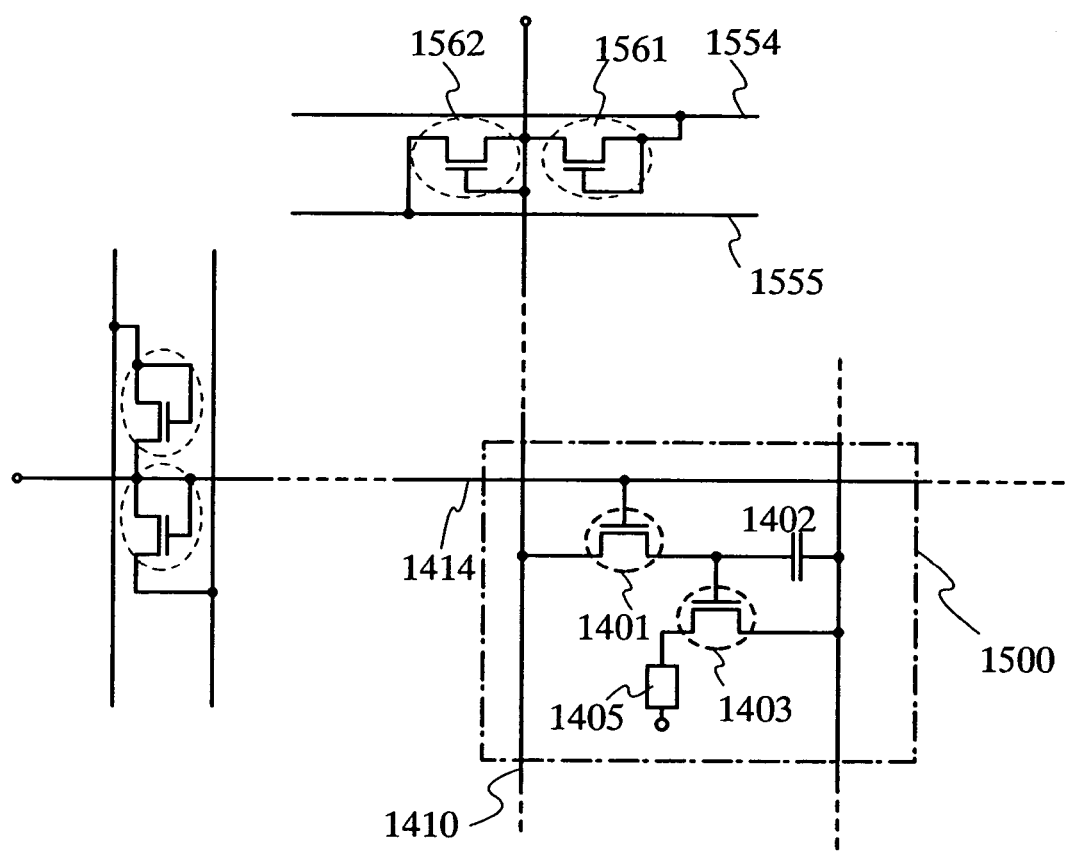
FIG. 11 is an equivalent circuit diagram showing an example of a protection circuit for a light emitting device.

FIG. 11 shows a pixel portion 1500 including a switching TFT 1401, a driving TFT 1403, a capacitor element 1402 and a light emitting element 1405. Diodes 1561 and 1562 are provided in the signal line 1410. The diodes 1561 and 1562 are formed in accordance with the above-mentioned embodiment mode as well as the switching TFT 1401 or the driving TFT 1403, and comprise gate electrodes, semiconductor layers, source electrodes, drain electrodes and the like, respectively. The diodes 1561 and 1562 are respectively operated by connecting the gate electrodes to the drain electrodes or the source electrodes.

Common potential lines 1554 and 1555 each of which is connected to the diode are formed in the same layer as the gate electrodes. Accordingly, contact holes are necessary to be formed in a gate insulating layer such that the source or drain electrodes of the respective diodes are connected to the common potential lines.

Diodes formed in the scanning line 1414 have the same structure.

According to the present invention, the diodes such as protection diodes formed in an input stage can simultaneously be formed. Further, the positions of the protection diodes are not limited to the above-mentioned configuration, and the protection diodes can be formed between the driver circuit and the pixel.

The display device of the invention with the above-described protection circuit comprises an excellent viewing angle dependency and can maintain the characteristics of the thin film transistor. As a result, the reliability of the display device can be improved.

Embodiment 1

The change in spectral shape depending on angles for seeing a light emitting device having a structure of the invention (e.g., the structure of FIG. 6C) and results of simulating and measuring the viewing angle dependencies are shown in this embodiment with reference to FIGS. 15A to 15C and FIGS. 16A and 16B. When a light emitting surface of a light emitting device is an ideal perfectly diffusing surface, i.e., when there is no viewing angle dependencies, the spectral shape is not varied and only the strength thereof is attenuated. With respect to the data of the viewing angle dependency, the closer a shape of a graph is to a perfect circle, the lower the viewing angle dependency is. Such the low viewing angle dependency indicates that the change in emission spectrum depending on angles for seeing the light extraction surface is small.

Figure 15A:
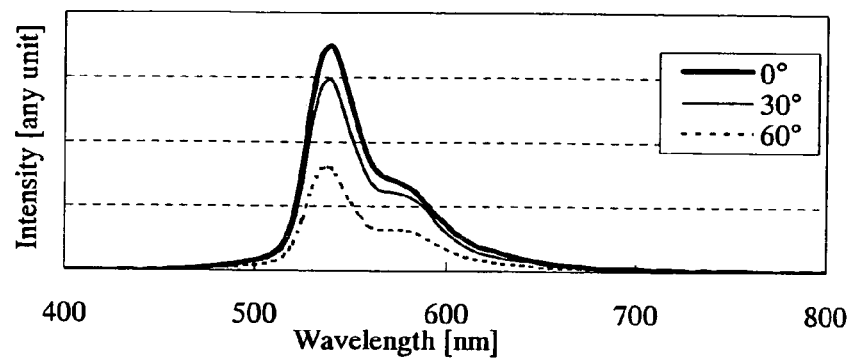
FIGS. 15A to 15C show experimental data obtained by measuring variation in spectrum based on angles for seeing a light emitting device according to the present invention and comparative examples.
Figure 15B:
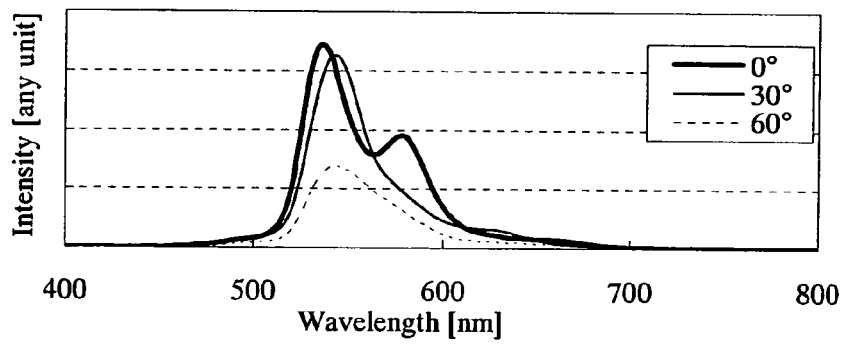

FIG. 15A shows the change in spectral shape according to angles for seeing the light emitting device of the invention having the structure as shown in FIG. 6C. As a comparative example 1, FIG. 15B shows change in spectral shape according to angles for seeing a light emitting device having a conventional structure as shown in FIG. 14B. Also, as a comparative example 2, FIG. 15C shows change in spectral shape according to angles for seeing a light emitting surface when the light emitting surface of a light emitting device is an ideal perfectly diffusing surface, i.e., when there is no viewing angle dependency.

With respect to the comparative example 1, the spectral shape is largely varied according to the angles for seeing the light emitting surface. Accordingly, it is known that colors of images are seen differently depending on the angles for seeing the images, even if the images are displayed on the light emitting device having the structure of the comparative example 1 in the same manner as the light emitting device having the structure of the invention.

Figure 15C:
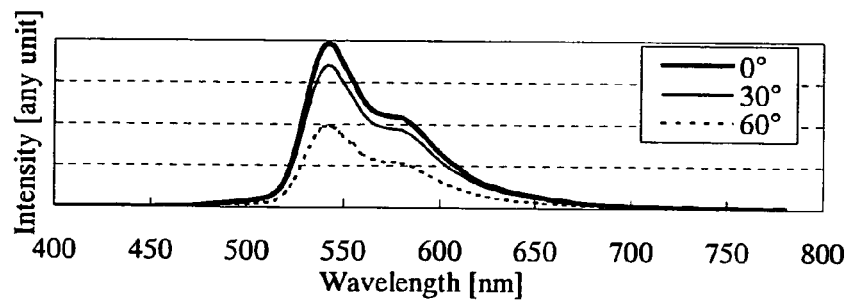

On the other hand, in accordance with FIG. 15A, the spectral shape is not largely changed according to the angles of seeing the light emitting surface in the light emitting device having the structure of the invention and the spectral shape is close to an ideal shape as shown in FIG. 15C. That is, colors of images displayed on the light emitting device of the invention are hardly changed according to the angles to be seen.

As a consequence, the light emitting device having the structure of the invention is a light emitting device in which the change in spectral shape caused by seeing the device from different angles is small. In addition, since the first base insulating layer mainly containing silicon nitride, which has an excellent effect of blocking an impurity from the substrate, remains in the opening in the light emitting device having the structure of the invention, a semiconductor element is hardly contaminated by the impurity intruding from the substrate. Therefore, the light emitting device has a thin film transistor with a high reliability.

Figure 16A:
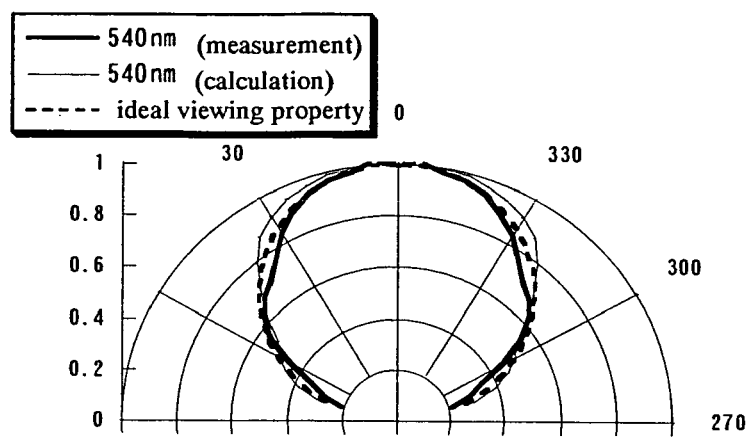
FIGS. 16A and 16B show experimental data and simulation data obtained by measuring the viewing angle dependencies of a light emitting device according to the present invention and a comparative example.
Figure 16B:
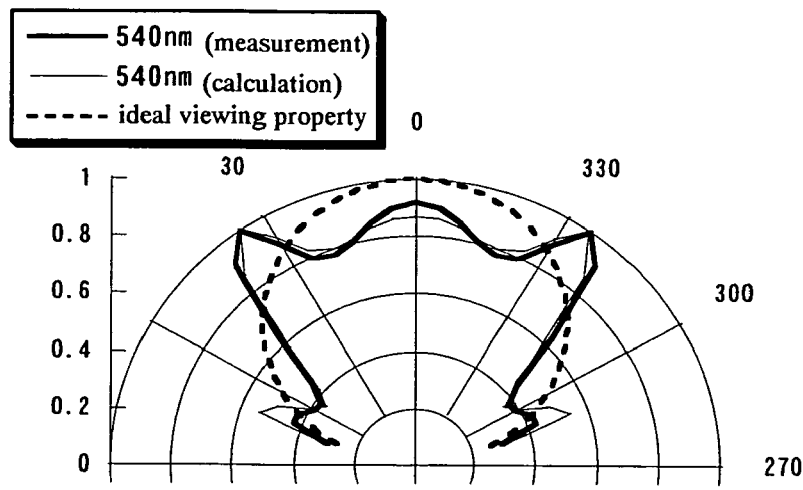

FIGS. 16A and 16B are graphs showing the viewing angle dependencies at a wavelength of 540 nm. In FIGS. 16A and 16B, thin lines denoted by "calculation" are calculated from simulation. FIG. 16A shows a viewing angle dependency of the light emitting device having the structure of the invention as shown in FIG. 6C while FIG. 16B shows a viewing angle dependency of a light emitting device having the conventional structure as shown in FIG. 14B.

As mentioned above, the data of the viewing angle dependencies in FIGS. 16A and 16B show that the closer a shape of the graph is to a perfect circle, the lower the viewing angle dependency is. Such a light emitting device with the lower viewing angle dependency can display images favorably. Further, in FIGS. 16A and 16B, data in the case where a light emitting surface of such a light emitting device is an ideal perfectly diffusing surface, i.e., in the case where the light emitting device with no viewing angle dependency is denoted by dashed lines for the sake of comparison.

Comparing FIGS. 16A and 16B, it is appeared that the light emitting device according to the present invention has a lower viewing angle dependency and can display images favorably in an almost ideal state.

As set forth above, the light emitting device with the structure of the invention has a lower viewing angle dependency. In addition, since a first base insulating layer mainly containing silicon nitride with an excellent effect of blocking an impurity from the substrate remains in the opening in the light emitting device with the structure of the invention, a semiconductor element is hardly contaminated by an impurity intruding from the substrate. Therefore, the light emitting device with the structure of the invention has a high reliability of a thin film transistor.

What is claimed is:

1. A light emitting device comprising:
    a first insulating layer formed over a substrate;
    a second insulating layer formed over the first insulating layer;
    a semiconductor layer formed over the second insulating layer;
    a gate insulating layer formed to cover the second insulating layer and the semiconductor layer;
    a gate electrode formed over the gate insulating layer;
    a first interlayer insulating layer formed to cover the gate insulating layer and the gate electrode;
    an opening formed in the first interlayer insulating layer, the gate insulating layer and the second insulating layer;
    a second interlayer insulating layer formed to cover the first insulating layer and the opening, the second interlayer insulating layer having a self-planarizing property; and
    a light emitting element formed over the opening,
    wherein the opening is formed to correspond to a light path through which light generated in the light emitting element is emitted to the outside of the light emitting device, and
    wherein the light is emitted to the outside of the light emitting device through the first insulating layer and the second interlayer insulating layer.

2. The light emitting device according to claim 1, further comprising a third insulating layer formed between the second interlayer insulating layer and the light emitting element.

3. A light emitting device comprising:
    a first insulating layer formed over a substrate;
    a second insulating layer formed over the first insulating layer;
    a semiconductor layer formed over the second insulating layer;
    a gate insulating layer formed to cover the second insulating layer and the semiconductor layer;
    a gate electrode formed over the gate insulating layer;
    a third insulating layer formed to cover the gate insulating layer and the gate electrode;
    a first interlayer insulating layer formed to cover the third insulating layer;
    an opening formed through the first interlayer insulating layer, the third insulating layer, the gate insulating layer and the second insulating layer;
    a second interlayer insulating layer formed to cover the first insulating layer and the opening, the second interlayer insulating layer having a self-planarizing property; and
    a light emitting element former over the opening,
    wherein the opening is formed to correspond to a light path through which light generated in the light emitting element is emitted to the outside of the light emitting device, and
    wherein the light is emitted to the outside of the light emitting device through the Firist insulating layer and the second interlayer insulating layer.

4. The light emitting device according to claim 3, further comprising a fourth insulating layer formed between the second interlayer insulating layer and the light emitting element.

5. The light emitting device according to claim 1,
    wherein the first insulating layer comprises silicon nitride; and
    wherein the second insulating layer comprises silicon oxide.

6. The light emitting device according to claim 2,
    wherein the third insulating layer comprises silicon nitride.

7. The light emitting device according to claim 4,
    wherein the fourth insulating layer comprises silicon nitride.

8. The light emitting device according to claim 3,
    wherein the first insulating layer comprises silicon nitride; and
    wherein the second insulating layer comprises silicon oxide.

9. The light emitting device according to claim 3,
    wherein the third insulating layer comprises silicon nitride.

10. The light emitting device according to claim 1,
    wherein the light emitting device is applied to an electronic appliance selected from the group consisting of a camera, a head mounted display, a navigation system, an audio reproduction device, a computer, a gate machine, a portable information terminal, an image reproduction device.

11. The light emitting device according to claim 3,
    wherein the light emitting device is applied to an electronic appliance selected from the group consisting of a camera, a head mounted display, a navigation system, an audio reproduction device, a computer, a gate machine, a portable information terminal, an image reproduction device.

12. A light emitting device comprising:
    a base insulating layer formed over a substrate;
    a semiconductor layer formed over the base insulating layer;
    a gate insulating layer formed over the base insulating layer and the semiconductor layer;
    a gate electrode formed over the gate insulating layer;
    a first interlayer insulating layer formed over the gate insulating layer and the gate electrode;
    an opening formed in at least the first interlayer insulating layer and the gate insulating layer;
    a second interlayer insulating layer formed over the base insulating layer and the opening, the second interlayer insulating layer having a self-planarizing property; and
    a light emitting element formed over the opening,
    wherein the opening is formed to correspond to a light path through which light generated in the light emitting element is emitted to the outside of the light emitting device, and wherein the light is emitted to the outside of the light emitting device through at least the base insulating layer and the second interlayer insulating layer.

13. The light emitting device according to claim 12, further comprising an insulating layer formed between the second interlayer insulating layer and the light emitting element.

14. A light emitting device comprising:
a base insulating layer formed over a substrate;
a semiconductor layer formed over the base insulating layer;
a gate insulating layer formed over the base insulating layer and the semiconductor layer;
a gate electrode formed over the gate insulating layer;
an insulating layer formed over the gate, insulating layer and the gate electrode;
a first interlayer insulating layer formed over the insulating layer;
an opening formed through at least the first interlayer insulating layer, the insulating layer and the gate insulating layer;
a second interlayer insulating layer formed over the base insulating layer and the opening, the second interlayer insulating layer having a self-planarizing property; and
a light emitting element formed over the opening,
wherein the opening is formed to correspond to a light path through which light generated in the light emitting element is emitted to the outside of the light emitting device, and
wherein the light is emitted to the outside of the light emitting device through at least the base insulating layer and the second interlayer insulating layer.

15. The light emitting device according to claim 14, further comprising a third insulating layer formed between the second interlayer insulating layer and the light emitting element.

16. The light emitting device according to claim 12, wherein the base insulating layer comprises silicon nitride.

17. The light emitting device according to claim 13, wherein the insulating layer comprises silicon nitride.

18. The light emitting device according to claim 15, wherein the third insulating layer comprises silicon nitride.

19. The light emitting device according to claim 14, wherein the base insulating layer comprises silicon nitride.

20. The light emitting device according to claim 14, wherein the insulating layer comprises silicon nitride.

21. The light emitting device according to claim 12, wherein the light emitting device is applied to an electronic appliance selected from the group consisting of a camera, a head mounted display, a navigation system, an audio reproduction device, a computer, a game machine, a portable information terminal, and an image reproduction device.

22. The light emitting device according to claim 14, wherein the light emitting device is applied to an electronic appliance selected from the group consisting of a camera, a head mounted display, a navigation system, an audio reproduction device, a computer, a game machine, a portable information terminal, and an image reproduction device.

23. The light emitting device according to claim 1, wherein the first insulating layer contains silicon nitride.

24. The light emitting device according to claim 3, wherein the first insulating layer contains silicon nitride.

25. The light emitting device according to claim 12, wherein the base insulating layer contains silicon nitride.

26. The light emitting device according to claim 14, wherein the base insulating layer contains silicon nitride.

27. The light emitting device according to claim 1, wherein the first insulating layer contains silicon nitride containing oxygen.

28. The light emitting device according to claim 3, wherein the first insulating layer contains silicon nitride containing oxygen.

29. The light emitting device according to claim 12, wherein the base insulating layer contains silicon nitride containing oxygen.

30. The light emitting device according to claim 14, wherein the base insulating layer contains silicon nitride containing oxygen.

31. The light emitting device according to claim 1, further comprising a source wiring and a drain wiring over the first interlayer insulating layer, the source wiring and the drain wiring electrically connected to the semiconductor layer, wherein the second interlayer insulating layer is formed over the source wiring and the drain wiring.

32. The light emitting device according to claim 3, further comprising a source wiring and a drain wiring over the first interlayer insulating layer, the source wiring and the drain wiring electrically connected to the semiconductor layer, wherein the second interlayer insulating layer is formed over the source wiring and the drain wiring.

33. The light emitting device according to claim 12, further comprising.a source wiring and a drain wiring over the first interlayer insulating layer, the source wiring and the drain wiring electrically connected to the semiconductor layer, wherein the second interlayer insulating layer is formed over the source wiring and the drain wiring.

34. The light emitting device according to claim 14, further comprising a source wiring and a drain wiring over the first interlayer insulating layer, the source wiring and the drain wiring electrically connected to the semiconductor layer, wherein the second interlayer insulating layer is formed over the source wiring and the drain wiring.

* * * * *